United States Patent
Wong et al.

(10) Patent No.: US 9,961,793 B1
(45) Date of Patent: May 1, 2018

(54) MODULAR ELECTRONIC DEVICE WITH IMPROVED RETENTION/RELEASE FEATURES AND RELATED ASSEMBLY METHODS

(71) Applicant: Google Inc., Mountain View, CA (US)

(72) Inventors: Jason Cinge Wong, Millbrae, CA (US); Jason Okamoto, Irvine, CA (US); Alvin Alza Dominguez, Union City, CA (US); Brett Mateo, Union City, CA (US)

(73) Assignee: Google Inc., Mountain View, CA (US)

( * ) Notice: Subject to any disclaimer, the term of this patent is extended or adjusted under 35 U.S.C. 154(b) by 0 days. days.

(21) Appl. No.: 15/353,820

(22) Filed: Nov. 17, 2016

Related U.S. Application Data

(60) Provisional application No. 62/256,995, filed on Nov. 18, 2015, provisional application No. 62/336,876, filed on May 16, 2016.

(51) Int. Cl.
| | | |
|---|---|---|
| H05K 5/00 | (2006.01) | |
| H05K 7/02 | (2006.01) | |
| H01R 12/73 | (2011.01) | |
| H01R 12/79 | (2011.01) | |
| H01R 43/26 | (2006.01) | |
| H05K 7/14 | (2006.01) | |
| H05K 9/00 | (2006.01) | |
| H05K 13/00 | (2006.01) | |
| H05K 1/14 | (2006.01) | |
| H05K 1/02 | (2006.01) | |

(52) U.S. Cl.
CPC .......... *H05K 7/026* (2013.01); *H01R 12/732* (2013.01); *H01R 12/79* (2013.01); *H01R 43/26* (2013.01); *H05K 1/028* (2013.01); *H05K 1/14* (2013.01); *H05K 7/1401* (2013.01); *H05K 9/0022* (2013.01); *H05K 13/0023* (2013.01); *H05K 2201/04* (2013.01)

(58) Field of Classification Search
CPC .......... H05K 7/026; H05K 1/028; H05K 1/14; H05K 7/1401; H05K 9/0022; H05K 13/0023; H05K 2201/04; H01R 13/732; H01R 12/79; H01R 43/26
USPC ................. 361/728–730, 747, 759, 801–803
See application file for complete search history.

(56) References Cited

U.S. PATENT DOCUMENTS

| | | | |
|---|---|---|---|
| 4,667,094 A * | 5/1987 | Van-Hecke | .......... H05K 7/1411 250/223 R |
| 5,211,565 A | 5/1993 | Krajewski et al. | |
| 5,506,373 A | 4/1996 | Hoffman | |
| 5,508,720 A | 4/1996 | DiSanto et al. | |
| 5,818,182 A | 10/1998 | Viswanadham et al. | |
| 5,818,691 A * | 10/1998 | McMahan | ............. E05C 19/022 361/679.43 |
| 5,832,371 A | 11/1998 | Thornton | |

(Continued)

FOREIGN PATENT DOCUMENTS

EP    2061298    5/2009

*Primary Examiner* — Hung S Bui
(74) *Attorney, Agent, or Firm* — Dority & Manning, P.A.

(57) ABSTRACT

An electronic module for a modular electronic device may include improved features for retaining the electronic module relative a frame of the modular electronic device and/or for subsequently removing such module from the frame. In addition, aspects of the present subject matter related to improved methods for assembling an electronic module for use with a modular electronic device.

24 Claims, 24 Drawing Sheets

(56) References Cited

U.S. PATENT DOCUMENTS

| | | | |
|---|---|---|---|
| 5,918,189 A | 6/1999 | Kivela | |
| 6,194,655 B1 | 2/2001 | Lange, Sr. et al. | |
| 6,640,113 B1 | 10/2003 | Shim et al. | |
| 6,943,527 B2 * | 9/2005 | Liu | G06F 1/1616 320/107 |
| 7,436,655 B2 | 10/2008 | Homer et al. | |
| 7,600,301 B2 | 10/2009 | Rudduck et al. | |
| 8,509,848 B1 | 8/2013 | Cole | |
| 8,827,331 B2 | 9/2014 | Corcoran et al. | |
| 9,621,229 B2 * | 4/2017 | Fishman | H04B 5/0037 |
| 2002/0146112 A1 | 10/2002 | Larson et al. | |
| 2005/0107046 A1 | 5/2005 | Desbarats et al. | |
| 2006/0273174 A1 | 12/2006 | Laitinen et al. | |
| 2011/0217031 A1 | 9/2011 | Eromaki | |
| 2012/0094527 A1 * | 4/2012 | Vroom | H01R 13/512 439/540.1 |
| 2013/0242150 A1 | 9/2013 | Wittenberg et al. | |
| 2015/0033167 A1 | 1/2015 | Helmes et al. | |

\* cited by examiner

MODULAR ELECTRONIC DEVICE WITH IMPROVED RETENTION/RELEASE FEATURES AND RELATED ASSEMBLY METHODS

PRIORITY CLAIM

The present application is based on and claims priority to U.S. Provisional Application 62/256,995 having a filing date of Nov. 18, 2015 and U.S. Provisional Application 62/336,876 having a filing date of May 16, 2016, which are incorporated by reference herein.

FIELD

The present subject matter relates generally to a modular electronic device including a plurality of interchangeable electronic modules and, more particularly, to improved features for retaining the electronic modules relative a frame of the modular electronic device and/or for subsequently removing such modules from the frame. In addition, the present subject matter also relates to methods for assembling electronic modules for use with a modular electronic device.

BACKGROUND

Smartphones and other portable electronic devices have become increasingly popular over the past several years. In a competitive market, continuous improvements and enhancements must be made to portable electronic devices to satisfy the increasing consumer demands and expectations regarding the performance and/or functionality of such devices. Recently, attempts have been made to develop a modular electronic device including interchangeable modules designed to be installed onto and removed from the device to provide increased flexibility with respect to performance and/or functionality. In doing so, it is has been recognized that consumers desire to be able to install and remove the modules quickly and easily from the device without significant effort.

SUMMARY

Aspects and advantages of embodiments of the invention will be set forth in part in the following description, or may be obvious from the description, or may be learned through practice of the embodiments.

In one aspect, the present subject matter is directed to a modular electronic device. The device may include a plurality of electronic modules. A first electronic module of the plurality of electronic modules may include a module housing. The device may also include a frame defining a plurality of bays. The frame may be adapted to respectively receive the electronic modules at the bays. A first bay of the plurality of bays may be configured to receive the first electronic module. Additionally, the device may include a fixed retention member associated with the frame and a release member associated with the module housing. The release member may be movable relative to the retention member between a locked position, wherein the retention member is configured to engage the release member so as to retain the first electronic module within the first bay, and an unlocked position, wherein the release member is disengaged from the retention member. Moreover, the device may include an electromechanical actuator provided in operative association with the release member for actuating the release member between the locked and unlocked positions. Further, the device may include an engagement detection circuit configured to provide an indication of whether the release member is located at the locked position relative to the retention member.

In another aspect, the present subject matter is directed to a method for assembling an electronic module configured for use with a modular electronic device. The method may generally include positioning a first shield component on a support surface and positioning a printed circuit board assembly on top of the first shield component such that the printed circuit board assembly is supported above the support surface. The method may also include installing at least one actuator component of an electromechanical actuator relative to the printed circuit board assembly and positioning a second shield component relative to the first shield component such that the printed circuit board assembly and the at least one actuator component are positioned between the first and second shield components.

In a further aspect, the present subject matter is directed to a method for assembling an electronic module configured for use with a modular electronic device. The method may generally include positioning a first shield component on a support surface and positioning a printed circuit board assembly on top of the first shield component such that the printed circuit board assembly is supported above the support surface. The printed circuit board assembly may include a printed circuit board and at least one internal component of the electronic module mounted to the printed circuit board. The method may also include positioning a second shield component relative to the first shield component such that the printed circuit board assembly is encased between the first and second shield components.

Other exemplary aspects of the present disclosure may be directed to other modular electronic devices, modules, systems, methods, apparatus, non-transitory computer-readable media, user interfaces and/or the like.

These and other features, aspects and advantages of the various embodiments will become better understood with reference to the following description and appended claims. The accompanying drawings, which are incorporated in and constitute a part of this specification, illustrate embodiments of the invention and, together with the description, serve to explain the related principles.

BRIEF DESCRIPTION OF THE DRAWINGS

Detailed discussion of embodiments directed to one of ordinary skill in the art, are set forth in the specification, which makes reference to the appended figures, in which.

DETAILED DESCRIPTION

Figure 1:
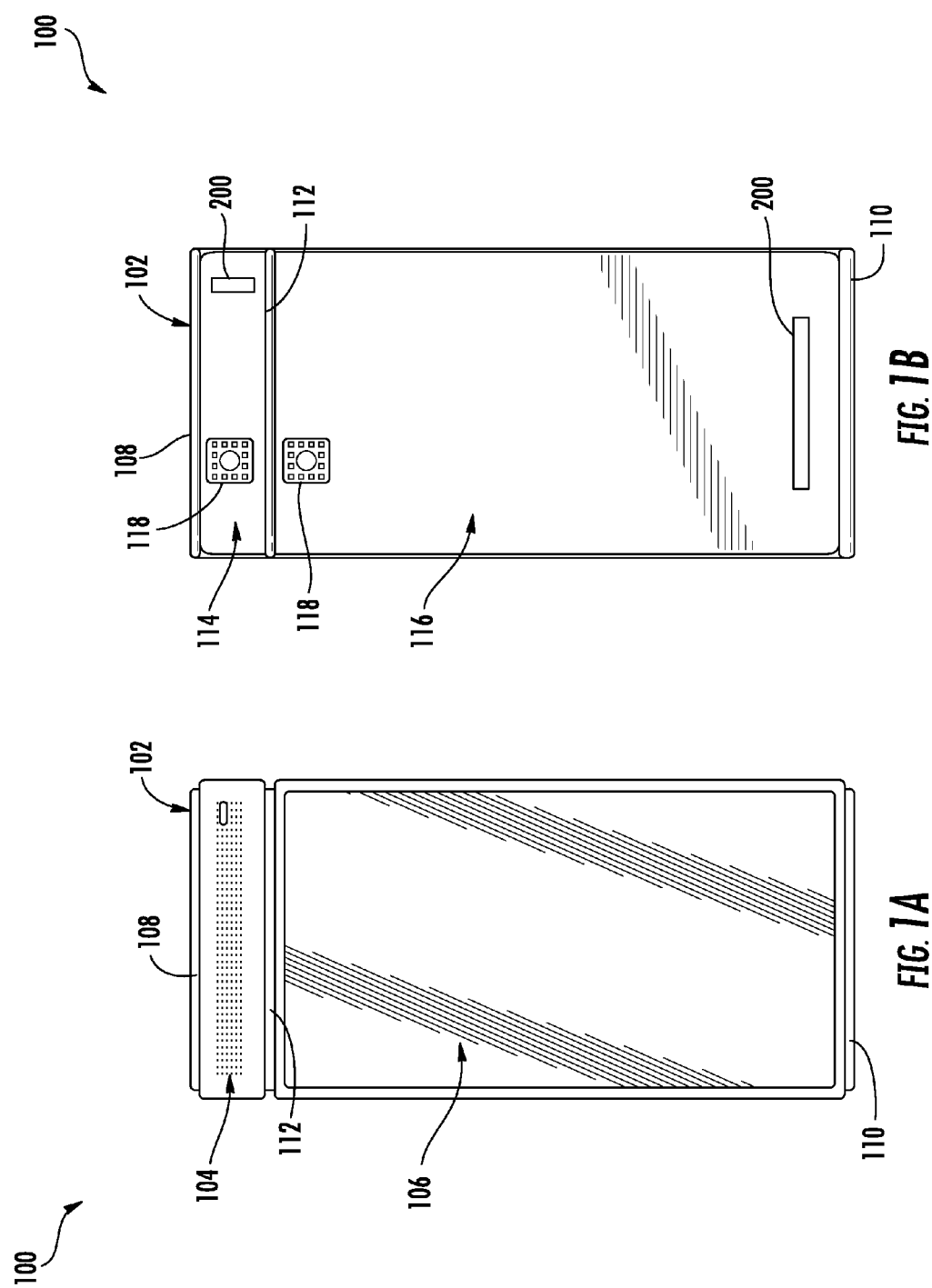
FIG. 1A illustrates a front view of one embodiment of a modular electronic device in accordance with aspects of the present subject matter, particularly illustrating electronic modules of the device being installed onto a front side of a frame of the device.
FIG. 1B illustrates another front view of the modular electronic device shown in FIG. 1A, particularly illustrating the electronic modules being removed from the frame so as to show the front side of the frame.

Reference now will be made in detail to embodiments, one or more examples of which are illustrated in the drawings. Each example is provided by way of explanation of the embodiments, not limitation. In fact, it will be apparent to those skilled in the art that various modifications and variations can be made to the embodiments without departing from the scope or spirit of the embodiments. For instance, features illustrated or described as part of one embodiment can be used with another embodiment to yield a still further embodiment. Thus, it is intended that the present subject matter cover such modifications and variations as come within the scope of the appended claims and their equivalents.

In general, the present subject matter is directed to a modular electronic device including a plurality of interchangeable electronic modules having improved retention/release features as well as related methods for assembling the electronic modules. In several embodiments, the modular electronic device may include a frame defining a plurality of slots or bays configured to receive corresponding electronic modules. Each bay may include a bottom wall or floor and one or more sidewalls extending outwardly from the floor so as to define an open-ended cavity for receiving one of the corresponding modules. Additionally, each electronic module may include a module housing that houses the various electronic components of the module, such as a printed circuit board supporting one or more processors and associated memory. The module housing may generally define any suitable shape that allows the housing to be received within the bay.

In accordance with aspects of the present subject matter, each bay defined by the frame and each associated electronic module may include one or more retention/release features that allow the electronic module to be retained within its corresponding bay when the module is installed therein and that also allow the module to be released or removed from the bay, when desired. Specifically, in several embodiments, the frame may include a fixed retention member extending outwardly from a wall of each bay (e.g., the bottom wall or floor of each bay) and each electronic module may include a release member at least partially housed within its associated module housing that is configured to releaseably engage the retention member. For example, the release member may be movable relative to the retention member between a locked position, wherein the retention member is configured to engage the release member so as to retain the electronic module within the bay, and an unlocked position, wherein the release member is disengaged from the retention member to allow the electronic module to be removed from the bay.

Additionally, in several embodiments, the electronic module may include an electromechanical actuator that is configured to actuate or move the release member between its locked and unlocked positions. For example, when it is desired to remove the electronic module from the bay, a suitable electrical signal may be transmitted to the electromechanical actuator. Upon receipt of the electrical signal, the electromechanical actuator may mechanically disengage the release member from the retention member, thereby allowing the electronic module to be removed from the bay.

As will be described below, in a particular embodiment of the present subject matter, the retention member may correspond to a projection or rib extending outwardly from the floor or bottom wall of each bay and the release member may correspond to a hook-like member at least partially housed within the module housing. In such an embodiment, the retention member may define one or more openings or slots configured to receive a portion of the release member when the release member is moved to its locked position. Additionally, in one embodiment, the electromechanical actuator may correspond to one or more shape memory wires coupled between the release member and a current source. In such an embodiment, when an electrical current is supplied through the shape memory wire(s), the wire(s) may contract, thereby pulling the release member away from the retention member and disengaging the electronic module from the frame. The electronic module may then be easily removed from the bay.

Moreover, in accordance with aspects of the present subject matter, one or more components of the electronic module may be incorporated into an engagement detection circuit to detect engagement between the release member and the retention member and/or to prevent overheating and/or other safety issues from arising once the module has been ejected from the frame. For example, in one embodiment, each shape memory wire of the electromechanical actuator may be coupled between the current source and a separate conductive member positioned on the release member at a location adjacent to the interface between the release member and the retention member. In addition, one or more ground members may be positioned on the retention member at a location adjacent to the interface between the release member and the retention member. As such, when the electronic module is installed within the frame, the conductive members may electrically contact the ground member(s) to complete the electrical circuit and allow the shape memory wires to contract upon activation of the circuit, thereby allowing the module to be unlatched from the frame. Once the release member has cleared the retention member and the electronic module pivots upwardly away from the fame, the conductive members may no longer contact the ground member(s), thereby opening the circuit and preventing further current flow through the shape memory wires. In another embodiment, a movable conductive member may be coupled to the release member that is configured to be compressed against a ground member when the release member is in the locked position relative to the retention member, thereby closing the corresponding electrical circuit and, thus, providing an indication that the electronic module has been properly installed relative the frame. In such an embodiment, when the release member is moved away from the retention member towards its unlocked position, the movable conductive member may spring or otherwise move outwardly away from the ground member, thereby opening the electrical circuit and providing an indication that the release member is being or has been disengaged from the retention member.

Further, as indicated above, the present subject matter is also directed to a method for assembling an electronic module. Specifically, in several embodiments, the printed circuit board (PCB) assembly for an electronic module may be configured as a stand-alone, structural component, with the module being constructed from the PCB assembly outward. For example, the PCB assembly may correspond to a completed surface-mount assembly. The completed PCB assembly may then be positioned on top of a first shield component (e.g., a fence shield) and subsequently coupled thereto. For instance, a solder pad may be provided around the outer perimeter of the PCB assembly for coupling the first shield component to the assembly. Thereafter, various other components of the electronic module may be installed relative to the PCB assembly, such as one or more components of the electromechanical actuator. Following the installation of such components, a second shield component (e.g., a shield can) may be placed over both the PCB assembly and the other installed components to complete the assembly of the electronic module. For example, the second shield component may be configured to snap onto and/or around a portion of the first shield component such that the PCB assembly and installed components are positioned between the first and second shield components.

Figure 2:
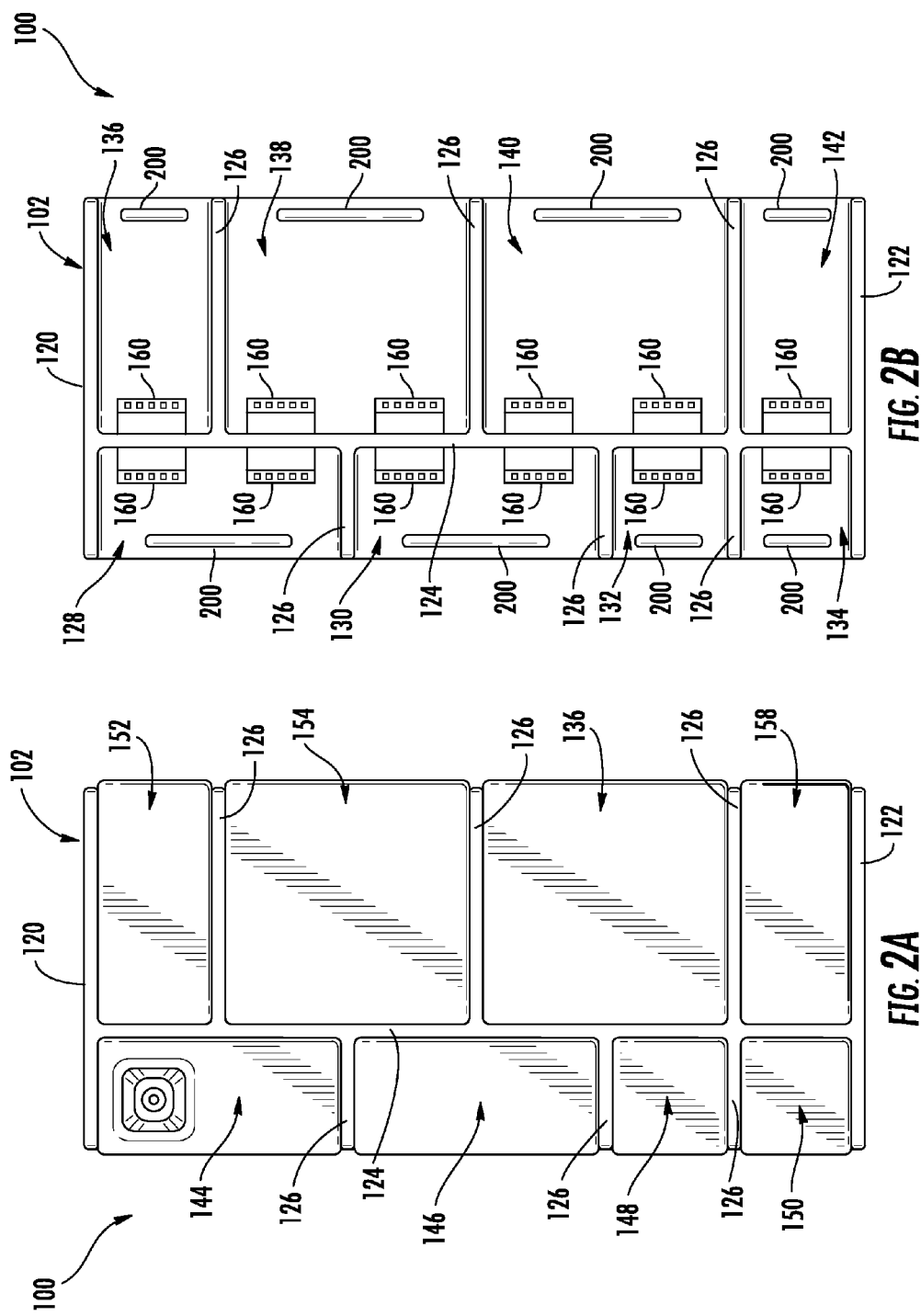
FIG. 2A illustrates a rear view of the modular electronic device shown in FIGS. 1A and 1B, particularly illustrating various electronic modules of the device being installed onto a rear side of the frame.
FIG. 2B illustrates another rear view of the modular electronic device shown in FIG. 2A, particularly illustrating the electronic modules being removed from the frame so as to show the rear side of the frame.

Referring now to FIGS. 1A-2B, several views of one embodiment of a modular electronic device 100 are illustrated in accordance with aspects of the present subject matter. Specifically, FIG. 1A illustrates a front view of the modular electronic device 100 including one or more electronic modules installed along the front side the device 100. FIG. 1B illustrates another front view of the modular electronic device 100 with the electronic module(s) removed from the front side of the device 100, partially illustrating one embodiment of a front side of an example frame 102 of the modular electronic device 100 in accordance with aspects of the present subject matter. FIG. 2A illustrates a rear view of the modular electronic device 100 including one or more electronic modules installed along the rear side of the device 100. Additionally, FIG. 2B illustrates another rear view of the modular electronic device 100 with the electronic module(s) removed from the rear side of the device 100, partially illustrating one embodiment of a rear side of the example frame 102 of the modular electronic device 100 in accordance with aspects of the present subject matter.

As particularly shown in FIGS. 1A and 1B, the modular electronic device 100 may include a frame 102 and a plurality of electronic modules 104, 106 configured to be installed along the front side of the frame 102. In general, the frame 102 may include a plurality of outwardly extending protrusions or walls 108, 110, 112 which serve to define or form a plurality of bays 114, 116 along the front side of the device 100. For example, in the illustrated embodiment, the frame 102 includes an upper front wall 108 extending outwardly from the front side of the frame 102 along the top of the device 100, a lower front wall 110 extending outwardly from the front side of the frame 102 along the bottom of the device 100 and an intermediate front wall 112 extending outwardly from the front side of the frame 102 at a location between the upper and lower front walls 108, 110. Such walls 108, 110, 112 may define or otherwise form the bays 114, 116 configured to receive the corresponding electronic modules 104, 106 along the front side of the device 100. For example, an upper bay 114 may be defined between the upper and intermediate front walls 108, 112. Similarly, a lower bay 116 may be defined between the lower and intermediate front walls 110, 112.

As indicated above, each bay 114, 116 defined along the front side of the frame 102 may be configured to removably receive a respective electronic module 104, 106. For example, an upper electronic module 104 may be installable within and removable from the upper bay 114. Similarly, a lower electronic module 106 may be installable within and removable from the lower bay 116. As particularly shown in FIGS. 1A and 1B, each of the electronic modules 104, 106 may be configured to define a footprint or shape that matches the size and shape of its corresponding bay 114, 116. Alternatively, the modules 104, 106 may define any other suitable shape that allows each module 104, 106 to be received within one of the bays 114, 116. In one embodiment, the upper electronic module 104 may correspond to a receiver or headset module while the lower electronic module 106 may correspond to a primary or front-facing display. However, in other embodiments, the electronic modules 104, 106 may correspond to any other suitable modular components configured for use with the disclosed modular electronic device 100.

As shown in FIG. 1B, each of the bays 114, 116 may have at least one data connection interface 118 associated therewith. As illustrated, each data connection interface 118 may include a number of pins or prongs that permit electric coupling for data and power transfer to the electronic module 104, 106 configured to be received within the corresponding bay 114, 116. However, other forms of data couplers can be used in addition or alternatively to the illustrated connection interface 118. For example, various ports, pluggable connections, magnetic (e.g., inductive) couplings, or optical couplings can be used between the interface 118 and the corresponding module 104, 106. It should be appreciated that each module 104, 106 may similarly include a corresponding data connection interface (not shown in FIGS. 1A and 1B) configured to electrically contact the data connection interface 118 of the bay in which the module 104, 106 is installed.

Referring now to FIGS. 2A and 2B, the frame 102 may also include any number of protrusions or walls extending outwardly from its rear side so as to define or form a plurality of bays for receiving a plurality of electronic modules along the rear side of the device 100. For example, in the illustrated embodiment, the frame 102 includes an upper rear wall 120 extending outwardly from the rear side of the frame 102 along the top of the device 100, a lower rear wall 122 extending outwardly from the rear side of the frame 102 along the bottom of the device 100 and a transverse rear wall 124 extending outwardly from the rear side of the frame 102 so as to extend lengthwise perpendicularly between the upper and lower rear walls 120, 122. Additionally, the frame 102 includes a plurality of intermediate rear walls 126 extending outwardly from the rear side of the frame 102 at locations between the upper and lower rear walls 120, 122, with each intermediate wall 126 extending lengthwise between an outer perimeter of the frame 102 and the transverse rear wall 124. Such walls 120, 122, 124, 126 may define or otherwise form the plurality of bays configured to receive the corresponding electronic modules. For example, in the illustrated embodiment, four separate bays (e.g., a first bay 128, a second bay 130, a third bay 132 and a fourth bay 134) may be defined between the adjacent walls 120, 122, 126 extending along a first side of the transverse rear wall 124 (e.g., the left side of the wall 124 as viewed in FIG. 2B.) and four separate bays (e.g., a fifth bay 136, a sixth bay 138, a seventh bay 140 and an eighth bay 142) may be defined between the adjacent walls 120, 122, 126 extending along a second side of the transverse rear wall 124 (e.g., the right side of the wall 124 as viewed in FIG. 2B.).

As indicated above, each bay 128, 130, 132, 134, 136, 128, 140, 142 defined along the rear side of the frame 102 may be configured to removably receive a respective electronic module. For example, as particularly shown in FIG. 2A, eight different electronic modules may be configured to be received within the corresponding bays, such as a first electronic module 144, a second electronic module 146, a third electronic module 148, a fourth electronic module 150, a fifth electronic module 152, a sixth electronic module 154, a seventh electronic module 156 and an eighth electronic module 158. In such an embodiment, the various modules 144, 146, 148, 150, 152, 154, 156, 158 may correspond to any suitable modules configured for use with the disclosed module electronic device 100. For instance, as an example, the first electronic module 144 may correspond to a camera module, the second electronic module 146 may correspond to a wireless network interface module (e.g., a Wi-Fi interface module, a cellular data module, or a short-range wireless radio module such as a Bluetooth module) and the third electronic module 148 may correspond to a speaker module. Various other types of modules may be received by the frame 102 as well, such as, for example, a positioning system module (e.g., a GPS module); a battery module, a USB interface module; a diversity antenna module; or various other types of modules. Further, the electronic modules may be interchangeable, swappable, or otherwise insertable into various different bays.

Additionally, each of the bays 128, 130, 132, 134, 136, 138, 140, 142 defined along the rear side of the frame 102 may have at least one data connection interface 160 associated therewith. Similar to the data connection interfaces 118 described above with reference to FIGS. 1A and 1B, each data connection interface 160 may include a number of pins or prongs that permit electric coupling for data and power transfer to the electronic module configured to be received within the corresponding bay. However, other forms of data couplers can be used in addition or alternatively to the illustrated connection interfaces 160. For example, various ports, pluggable connections, magnetic (e.g., inductive) couplings, or optical couplings can be used between the interface 116 and the corresponding module. It should be appreciated that each module 144, 146, 148, 150, 152, 154, 156, 158 may similarly include a corresponding data connection interface (not shown in FIGS. 2A and 2B) configured to electrically contact the data connection interface 160 of the bay in which the module is installed.

Moreover, as will be described in detail below, the frame 102 may also include one or more features for retaining each electronic module within its respective bay and/or for releasing such module from its respective bay when desired. For example, as shown in FIGS. 1B and 2B, each bay may, in one embodiment, include a retention member 200 associated therewith that is configured to engage a corresponding release member 202 (FIG. 6) associated with each electronic module. As such, when installing each module within its respective bay, the electronic module may be secured within the bay by engaging the retention/release members 200, 202. Similarly, the retention/release members 200, 202 may be disengaged to allow the module to be subsequently removed from its corresponding bay.

Figure 3:
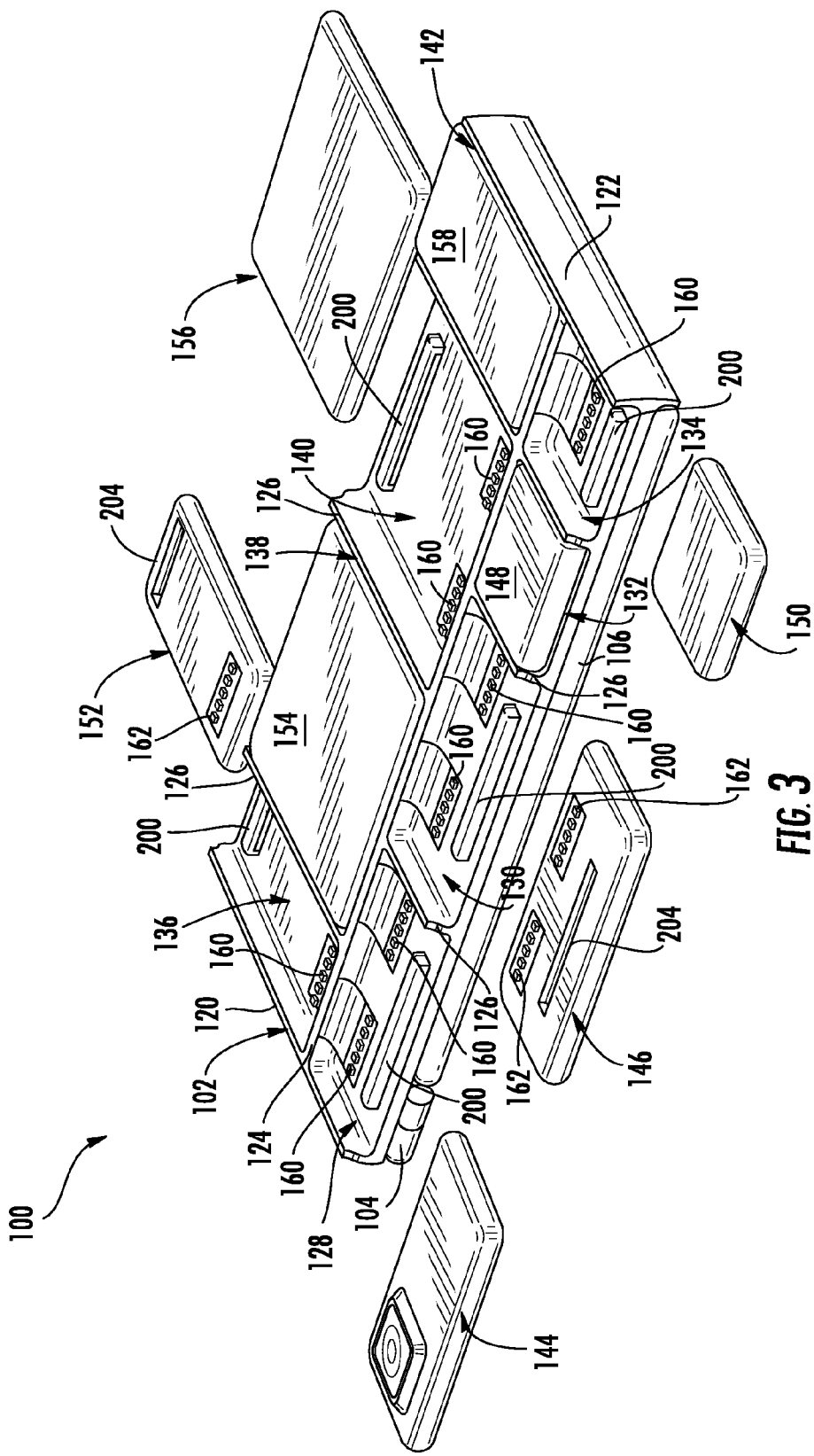
FIG. 3 illustrates a perspective view of the rear side of the electronic module device shown in FIGS. 2A and 2B, particularly illustrating the various electronic modules being positioned in differing states relative to the frame.

Referring now to FIG. 3, a perspective view of the rear side of the modular electronic device 100 shown in FIGS. 2A and 2B is illustrated in accordance with aspects of the present subject matter. In particular, FIG. 3 depicts the electronic modules 144, 146, 148, 150, 152, 154, 156, 158 in various states of insertion or connection to the frame 102. For example, the third, sixth and eighth electronic modules 148, 154, 158 are shown as being received within their corresponding bays 132, 138, 142. Similarly, the first, second, fourth, fifth and seventh electronic modules 144, 146, 150, 152, 156 are shown as being removed from or otherwise not presently installed within their corresponding bays 128, 130, 134, 136, 140, with the second and fifth electronic modules 146, 152 being oriented with their lower side facing up such that a data connection interface(s) 162 of each of the electronic modules 146, 152 is illustrated. As an example, when the second electronic module 146 is installed within the second bay 130 of the frame 102, the data connection interface(s) 162 of such module 146 may be configured to engage with the corresponding data connection interface(s) 160 of the second bay 130 to form a plurality of electrical contacts over which data can be transferred according to various techniques.

Additionally, as shown in FIG. 3, each module 144, 146, 148, 150, 152, 154, 156, 158 may, in several embodiments, define an inwardly extending cavity 204 along its exterior that is configured to receive the retention member 200 associated with the bay within the module is configured to be installed. As will be described below with reference to FIGS. 7 and 8, the release member 202 of each module may be configured to extend outwardly into the cavity 204 and engage the retention member 200 in order to secure the module to the frame 102. Similarly, the release member 202 may be disengaged from the retention member 200 (e.g., by at least partially recessing the release member 202 relative to the cavity 204) to allow each module to be removed from its corresponding bay.

It should be appreciated that the particular shapes, sizes, orientations, numbers arrangements and configurations of the electronic modules and bays illustrated in FIGS. 1A-3 are simply provided for example purposes only. Those of ordinary skill in the art should readily understand that various different shapes, sizes, orientations, numbers arrangements and/or configurations of the modules and/or bays may be used without deviating from the scope of the present subject matter.

Figure 4:
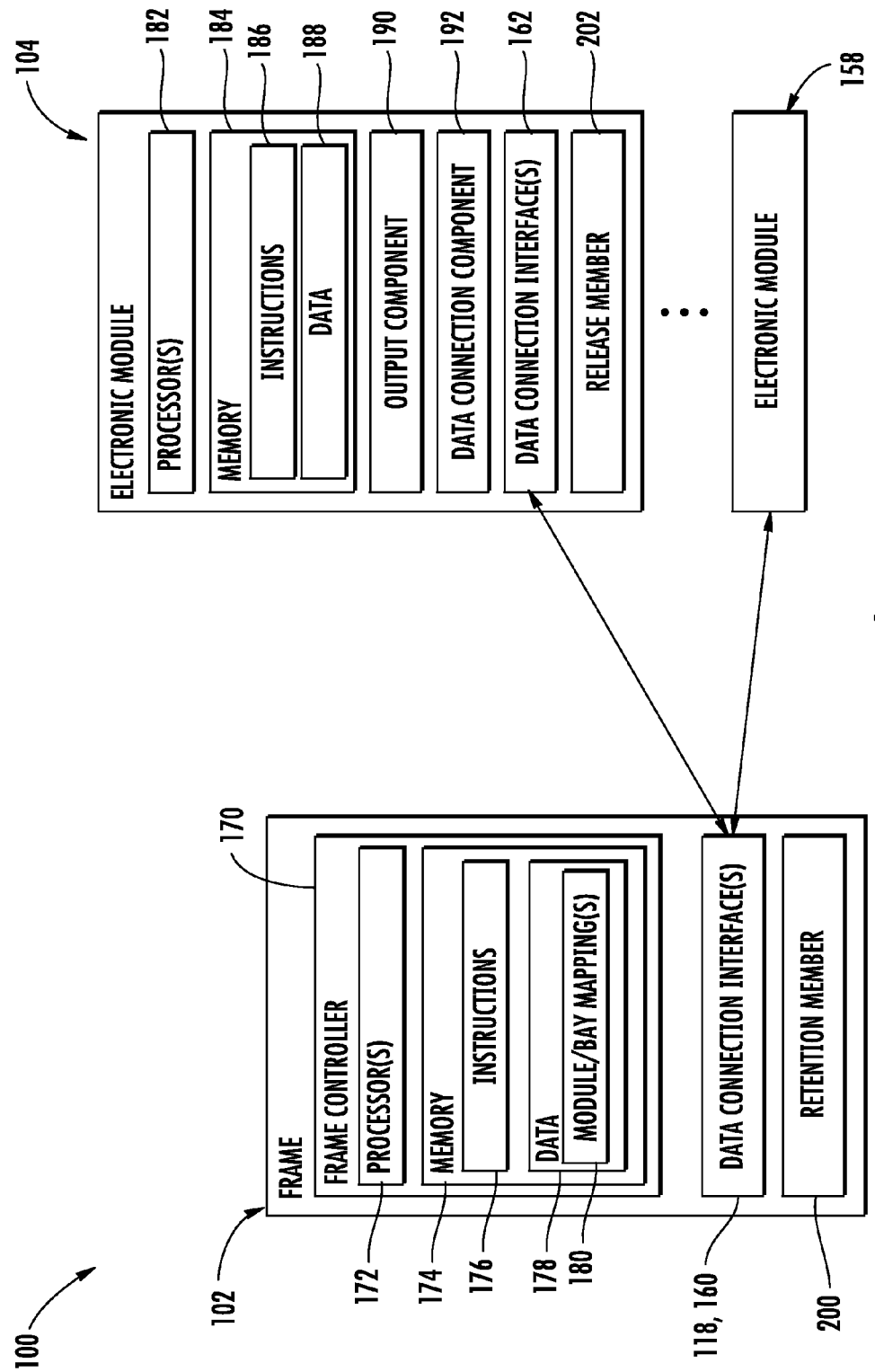
FIG. 4 illustrates a block diagram of one embodiment of various components that may be included within the disclosed modular electronic device in accordance with aspects of the present subject matter.

Referring now to FIG. 4, a block diagram of one embodiment of various components that may be included within the disclosed modular electronic device 100 is illustrated in accordance with aspects of the present subject matter. As indicated above, the modular electronic device 100 may include a frame 102 and a plurality of electronic modules configured to be installed on the frame 102. For purposes of illustration, only two of the electronic modules 104, 158 have been shown in FIG. 4. However, as described above, the modular electronic device 100 may include any number of electronic modules configured to be installed along the front side and/or rear side of the frame 102. Similarly, the number of electronic modules included within the modular electronic device 100 may change over time as modules are swapped in and out of the frame 102.

As shown in FIG. 4, the frame 102 may include a frame controller 170. In general, the frame controller 170 may include one or more processors 172 and a memory 174. The processor(s) 172 may be any suitable processing device, such as a microprocessor, microcontroller, integrated circuit, or other suitable processing device. Similarly, the memory 174 may include any suitable computer-readable medium or media, including, but not limited to, non-transitory computer-readable media, RAM, ROM, hard drives, flash drives, or other memory devices. The memory 174 may generally store information accessible by processor(s) 172, including instructions 176 that can be executed by processor(s) 172 and data 178 that can be retrieved, manipulated, created, or stored by processor(s) 172. In several embodiments, the data 178 may be stored in one or more databases.

For example, the memory 174 may store a module/bay mapping database 180 that stores data that maps or logically associates the various electronic modules of the device 100 with the corresponding bays in which they are received. Thus, the module/bay mapping data may serve as a roster that maps installed modules to the bays in which they are respectively received. In such an embodiment, the frame controller 170 may update the module/bay mapping whenever an electronic module is inserted or removed from the frame 102, and/or on a periodic basis.

In addition, as indicated above, the frame 102 may also include at least one data connection interface 118, 160 that communicatively couples the plurality of electronic modules to the frame controller 170 for transferring data and power between the frame and the modules. As one example, the frame 102 may include at least one data connection interface 118, 160 in each of the plurality of bays. The data connection interface(s) 118, 160 may provide bi-directional communications between the frame controller 102 and each electronic module via one or more electrical, magnetic (e.g., inductive), or optical couplings between the interface 118, 160 and the corresponding module (e.g., with a complementary data connection interface 162 of the electronic module). As an example, the data connection interface(s) 118, 160 of each bay may include a number of complementary pairs of prongs, pins, contacts, or the like to form a number of serial data connections or other forms of data connection. In other implementations, the data connection interface(s) 118, 160 of the frame 102 may perform wireless communication with one or more of the electronic modules (e.g., according to a short-range wireless communications protocol such as Bluetooth).

Moreover, the frame 102 may also include one or more retention/release features that facilitate retaining each module relative to the frame 102 and/or removing each module from the frame 102. For example, as indicated above, the frame 102 may, in one embodiment, include a retention member 200 provided in each bay that is configured to engage a corresponding release member 202 of the module installed within the bay. One embodiment of the retention member 200 will be described in detail below with reference to FIGS. 5-10.

Referring still to FIG. 4, in several embodiments, each module 104, 158 may include one or more processors 182 and a memory 184. As is generally understood, the processor(s) 182 and the memory 184 may be supported on a printed circuit board of each module 104, 158. The processor(s) 182 may be any suitable processing device, such as a microprocessor, microcontroller, integrated circuit, or other suitable processing device. Similarly, the memory 184 may include any suitable computer-readable medium or media, including, but not limited to, non-transitory computer-readable media, RAM, ROM, hard drives, flash drives, or other memory devices. The memory 184 may generally store information accessible by processor(s) 182, including instructions 186 that can be executed by processor(s) 182 and data 188 that can be retrieved, manipulated, created, or stored by processor(s) 182. In several embodiments, the data 188 may be stored in one or more databases.

It should be appreciated that, in other embodiments, each module 104, 158 may not include a processor. Instead, the memory 184 may store computer-readable instructions 186 that are configured to be executed by the frame controller 170. In such an embodiment, execution of the instructions 186 stored in the memory 184 by the frame controller 170 may enable the functionality provided by the individual electronic module 104, 158.

Moreover, in one embodiment, each module 104, 158 may include an output component 190 configured to perform an output function, such as, for example, outputting light, images, sound and/or haptic feedback. As examples, the output component 190 may include a speaker, a visual battery life indicator, a front- or rear-facing display, a wireless communications interface (e.g., a wireless network radio), a flashlight, or various other components that output light, images, sound, or haptic feedback.

In addition to the output component 190 (or as an alternative thereto), each electronic module 104, 158 may include a data collection component 192. In general, the data collection component 192 may include any component, sensor, device, etc. that collects or generates data indicative of a physical condition. As examples, the data collection component 192 may include a pulse monitor, an oxygen level monitor, a glucose monitor, a credit card reader, a camera, a microphone, and/or various other types of sensors that collect data about a physical condition.

Referring still to FIG. 4, each electronic module 104, 158 may also include one or more data connection interfaces 162. In several embodiments, the data connection interface(s) 162 for each module 104, 158 may be the same as, similar to, or complementary to the data connection interface(s) 118, 160 described above with reference to the frame 102. For example, the data connection interface(s) 162 may include a number of prongs, pins, or other electrical connections that are designed to mate with complementary connections at the data connection interface(s) 118, 160 of the frame 102.

Additionally, each electronic module 104, 158 may include one or more retention/release features that facilitate retaining each module relative to the frame 102 and/or removing each module from the frame 102. For example, as indicated above, each electronic module 104, 158 may, in one embodiment, include a release member 202 that is configured to engage the corresponding retention member 200 provided in the bay in which the module is being installed. One embodiment of the release member 202 of each module 104, 158 will generally be described in detail below with reference to FIGS. 5-10.

Figure 5:
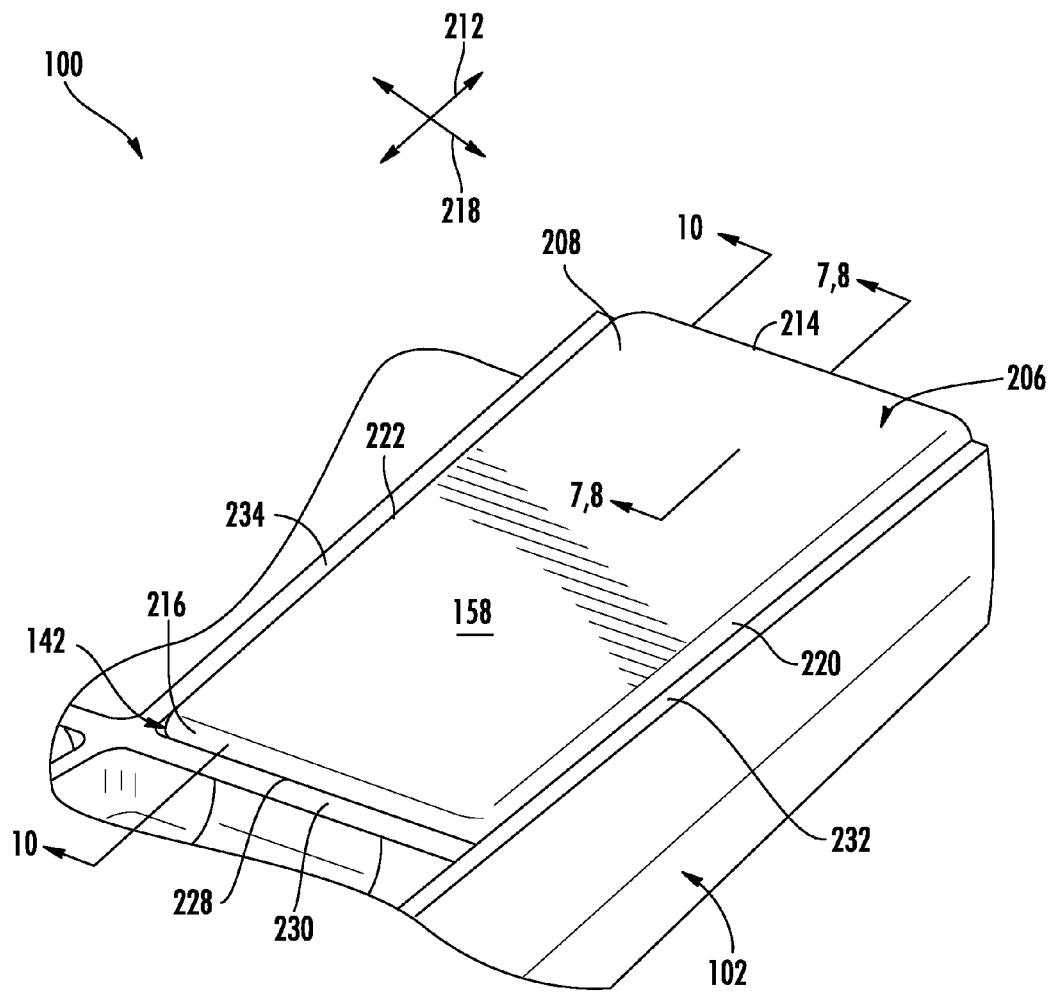
FIG. 5 illustrates a perspective view of a portion of the modular electronic device shown in FIG. 3, particularly illustrating an electronic module of the device installed within a corresponding bay defined by the frame.
Figure 6:
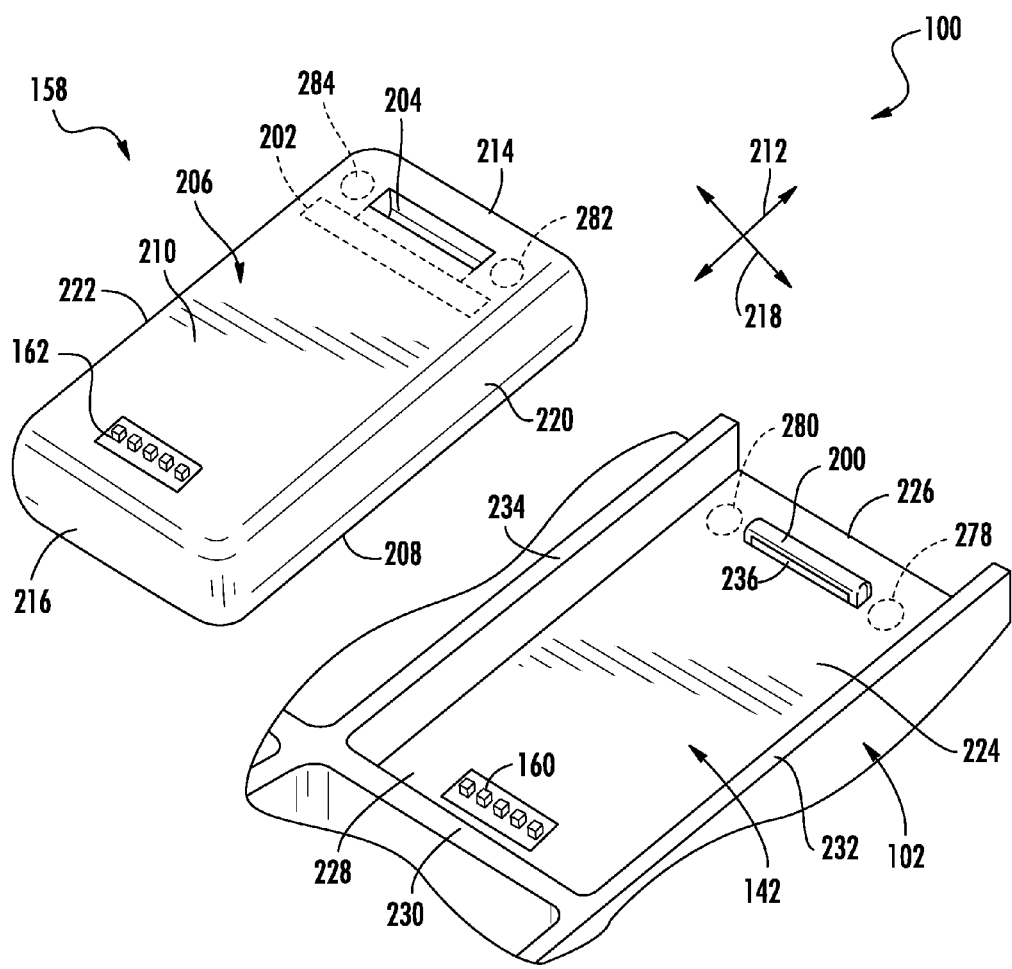
FIG. 6 illustrates another perspective view of the portion of the modular electronic device shown in FIG. 5, particularly illustrating the electronic module being exploded away from its corresponding bay and being flipped 180 degrees to show the side of the module configured to face towards the floor or bottom wall of the bay.

Referring now to FIGS. 5 and 6, one embodiment of suitable retention/release features that may be included within the modular electronic device 100 for coupling and decoupling the electronic modules to/from the frame 102 will now be described in accordance with aspects of the present subject matter. Specifically, FIG. 5 illustrates a partial perspective view of the rear side of the modular electronic device 100 shown in FIG. 3, with one of the electronic modules 158 being installed within its corresponding bay 142. Additionally, FIG. 6 illustrates another perspective view of the portion of the modular electronic device 100 shown in FIG. 5, with the electronic module 158 being exploded away from its corresponding bay 142 and flipped over to show the side of the module 158 configured to face downwardly within the bay 142.

For simplicity purposes, it should be appreciated that the disclosed retention/release features will be described in detail herein with reference to one of the electronic modules described above with reference to FIGS. 1A-3 (e.g., the eighth electronic module 158) as well as its corresponding bay (e.g., the eighth bay 142) defined within the frame 102. However, as indicated above, each of the electronic modules 104, 106, 144, 146, 148, 150, 152, 154, 156, 158 and corresponding bays 114, 116, 128, 130, 132, 134, 136, 138, 140, 142 may include the same or similar features for retaining/releasing each module relative to the disclosed frame 102.

As shown in the illustrated embodiment, the electronic module 158 may include a module housing 206 forming the outer covering or casing of the module 158. As such, the module housing 206 may be configured to encase and/or enclose the various internal components of the electronic module 158, such as the processor(s) 182, memory 184 and/or the like. It should be appreciated that the module housing 206 may be formed from one or more housing components. For instance, as will be described below with reference to FIGS. 18-22, the module housing 206 may be formed from first and second shield components configured to be coupled together to encase the various internal components of the electronic module 158.

As particularly shown in FIG. 5, the module housing 206 may include an upper wall 208 defining an upper surface of the electronic module 158 (e.g., the portion of the outer surface that is visible when the module 158 is installed within its corresponding bay 142). Similarly, as shown in FIG. 6, the module housing 206 may include a lower wall 210 opposite the upper wall 208 that generally defines a lower surface of the electronic module 158. The upper and lower walls 208, 210 may generally be configured to extend in a lengthwise direction of the electronic module 158 (e.g., as indicated by arrow 212 in FIGS. 5 and 6) between a first end 214 and a second end 216. In addition, the upper and lower walls 208, 210 may generally be configured to extend in a widthwise direction of the electronic module 158 (e.g., as indicated by arrow 218 in FIGS. 5 and 6) between a first side 220 and a second side 222.

Similarly, as shown in FIG. 6, the bay 142 may include a bottom wall or floor 224 configured to extend adjacent to the lower wall 210 of the module housing 206 when the electronic module 158 is installed within the bay 142. In general, the bay floor 224 may be configured to extend in the lengthwise direction 212 between a first end 226 and a second end 228. As shown in the illustrated embodiment, the first end 226 of the bay floor 224 may generally terminate along an open-ended side of the bay 142 defined along the outer perimeter of the frame 102 while the second end 228 of the bay floor 224 may terminate at an adjacent rear wall 230 of the bay 142 (e.g., formed by a portion of the transverse rear wall 124 shown in FIG. 2B). Similarly, the bay floor 224 may be configured to extend in the widthwise direction 218 between a first sidewall 232 of the bay 142 (e.g., formed by a portion of the lower rear wall 122 shown in FIG. 2B) and a second sidewall 234 of the bay 142 (e.g., formed by one of the intermediate rear walls 126 shown in FIG. 2B).

As indicated above, the electronic module 158 may generally define an overall shape or footprint that matches or is complementary to the shape of the bay 142. Thus, as shown in FIG. 5, when the electronic module 158 is installed within the bay 142, the first end 214 of the module housing 206 may generally be positioned adjacent to and/or aligned with the first end 226 of the bay 142 while the second end 216 of the module housing 206 may generally be positioned adjacent to and/or aligned with the second end 228 of the bay 142. Similarly, as shown in the illustrated embodiment, when the electronic module 158 is installed within the bay 142, the first side 220 of the module housing 206 may generally be positioned adjacent to the first sidewall 232 of the bay 142 while the second side 232 of the module housing 206 may generally be positioned adjacent to the second sidewall 234 of the bay 142.

As indicated above, in several embodiments, a retention member 200 may be provided in association with each bay that serves as a means for retaining each electronic module relative to the frame 102. For example as shown in FIG. 6, in one embodiment, the retention member 200 may correspond to a projection or rib extending outwardly from the bay floor 224 that defines one or more open ended retention slots 236. As will be described below, the retention slot(s) 236 may be configured to receive a portion of the corresponding release member 202 of the electronic module 158 when the module 158 is installed within the bay 142. As such, the retention member 200 may be configured to engage the release member 202, thereby retaining the electronic module 158 within the bay 142.

Additionally, as indicated above, the module housing 206 may define an inwardly extending cavity 204 configured to receive the retention member 200 when the electronic module 158 is installed within the bay 142. For example, as shown in FIG. 6, a portion of the lower wall 210 may be recessed relative to the remainder of the lower wall 210 such that the module housing 206 defines the inwardly extending cavity 204. As will be described in greater detail below, when the retention member 200 is received within the cavity 204, the release member 202 of the electronic module 158 may be configured to be moved relative to the cavity 204 so as to allow the release member 202 to be selectively engaged with the retention member 200. For example, the release member 202 may be moved to a locked position relative to the retention member 200 at which a portion of the release member 202 is received within the retention slot 236 defined by the retention member 200, thereby allowing the release member 202 to be engaged against the retention member 204. Similarly, the release member 202 may be moved to an unlocked position relative to the retention member 200 at which the release member 202 is withdrawn from the open-ended retention slot 236, thereby allowing the release member 202 to be disengaged from the retention member 200.

Figure 7:
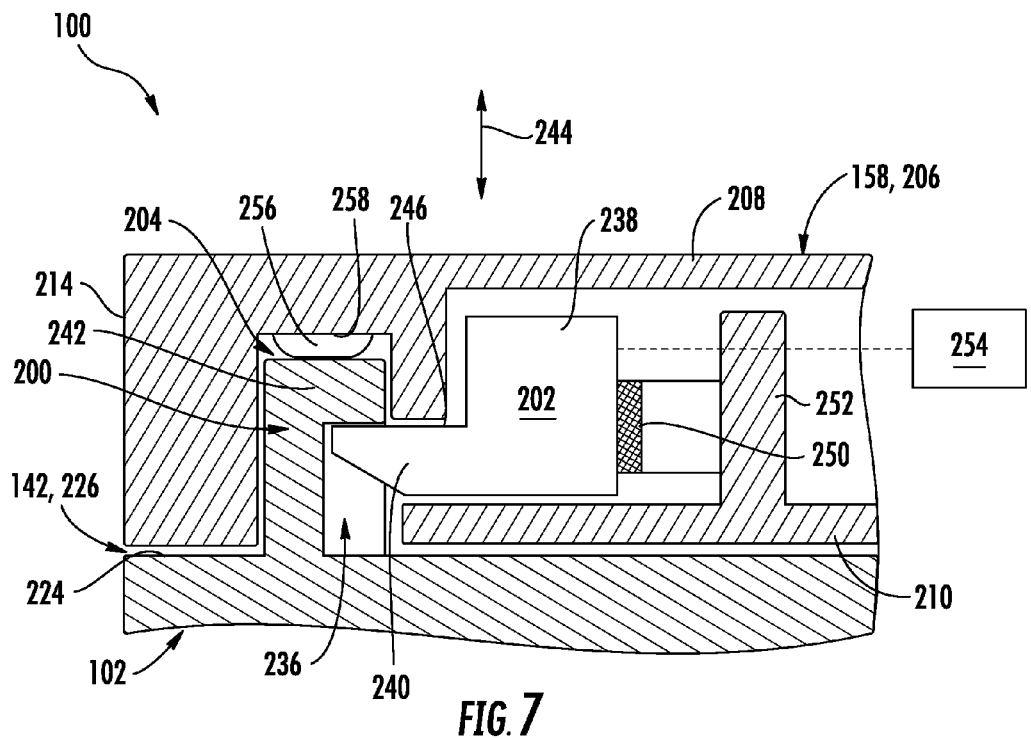
FIG. 7 illustrates a cross-sectional view of the portion of the modular electronic device shown in FIG. 5 taken about line 7,8-7,8, particularly illustrating a release member of the electronic module being positioned at a locked position relative to a retention member of the frame.
Figure 8:
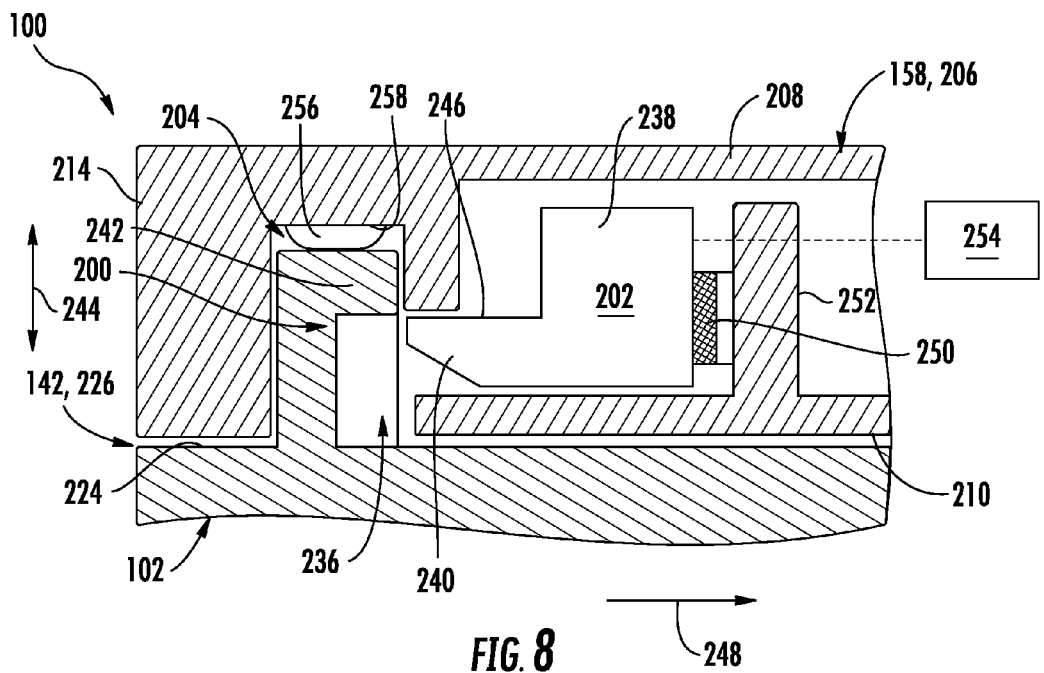
FIG. 8 illustrates another cross-sectional view of the portion of the modular electronic device shown in FIG. 5 taken about line 7,8-7,8, particularly illustrating the release member being positioned at an unlocked position relative to the retention member.

Referring now to FIGS. 7 and 8, cross-sectional views of a portion of the modular electronic device 100 shown in FIG. 5 taken about line 7,8-7,8 are illustrated in accordance with aspects of the present subject matter. In particular, FIG. 7 illustrates the release member 202 of the electronic module 158 in its engaged or locked position relative to the retention member 200 while FIG. 8 illustrates the release member 202 in its disengaged or unlocked position relative to the retention member 200.

As shown in FIGS. 7 and 8, the release member 200 may be correspond to a hook or may otherwise have a hook-like configuration. For example, the release member 200 may include a base portion 238 configured to be received within the module housing 206 and an engagement portion 240 extending outwardly from the base portion 238 in the direction of the cavity 204 defined by the module housing 206. In several embodiments, when the release member 200 is moved to the locked position, the engagement portion 240 of the release member 200 may be configured to extend outwardly from the interior of the housing 206 and into the cavity 204 so as to be received within the open-ended slot 236 defined by the retention member 200. As such, the engagement portion 240 of the release member 202 may be provided in a overlapped configuration with an outer portion 242 of the retention member 200 forming the top of the retention slot 236, thereby preventing the electronic module 158 from being moved relative to the frame 102 in a retention direction (e.g., as indicated by arrow 244 in FIGS. 7 and 8). For example, as shown in FIG. 7, an outer surface 246 of the engagement portion 240 of the release member 202 may be configured to contact or otherwise engage the outer portion 242 of the retention member 200 when the electronic module 158 is moved relative to the frame 102 in the retention direction 244.

Additionally, as shown in FIG. 8, when the release member 202 is moved to the unlocked position, the engagement portion 240 of the release member 202 may be configured to be withdrawn from the retention slot 236 defined by the retention member 200. For example, the release member 202 may be moved within the module housing 206 in a release direction (as indicated by arrow 248 in FIG. 8) away from the retention member 200 such that the engagement portion 240 is removed from the retention slot 236 and is least partially received or recessed within housing 206. As such, the release member 202 may be completely disengaged from the retention member 200, thereby allowing the electronic module 158 to be moved relative to the frame 102 in the retention direction 244.

Moreover, in several embodiments, a biasing member 250 may be provided within the module housing 206 that is configured to bias the release member 202 into its locked position. For example, as shown in FIGS. 7 and 8, in one embodiment, the biasing member 250 may correspond to a spring positioned between the release member 202 and an internal wall 252 of the module housing 206 such that the spring applies a biasing force against the release member 202 that pushes the release member 202 in the direction of the retention member 202. In such an embodiment, to move the release member 202 to its unlocked position, an opposing force may be applied to the release member 202 that overcomes the biasing force applied by the spring and pulls or moves the release member 202 in the release direction 248. In doing so, the spring may be compressed between the release member 202 and the internal wall 252 as the release member 202 is moved to its unlocked position. As such, when the opposing force is removed, the release member 202 may automatically return to its locked position via the biasing force applied by the spring.

It should be appreciated that, in other embodiments, the biasing member 250 may correspond to any other suitable component(s) and/or member(s) that is configured to apply a biasing force against the release member 202 so as to bias the release member 202 into its locked position. For instance, in another embodiment, the biasing member 250 may correspond to a deformable or compressible element positioned between the release member 202 and the internal wall 252 or one or more magnets configured to apply a biasing force against the release member 202.

As shown in FIGS. 7 and 8, in several embodiments, the electronic module 158 may also include an electromechanical actuator 254 that is coupled to or otherwise provided in operative association with the release member 202 (as indicated by the dashed line) so as to actuate the release member 202 between its locked and unlocked positions. Specifically, the electromechanical actuator 254 may be configured to apply a force against the release member 202 in the release direction 248 that overcomes the biasing force applied by the biasing member 250, thereby allowing the release member 202 to be moved to its unlocked position. As such, when it is desired to remove the electronic module 158 from its corresponding bay 142, the electromechanical actuator 254 may be used to automatically actuate the release member 202 to its unlocked position so as to disengage the electronic module 158 from the frame 102. For example, a user of the modular electronic device 100 may provide a suitable user input indicating his/her desire to remove the electronic module 158 from its bay 142. The electronic components associated with the frame 102 (e.g., the frame controller 170) and/or the module 158 (e.g., the processor(s) 182) may then transmit a suitable control signal(s) to the electromechanical actuator 254 to cause the release member 202 to be moves to its unlocked position.

In general, the electromechanical actuator 254 may correspond to any suitable device(s) and/or component(s) that is configured to convert an electrical input signal into mechanical motion that may be used to actuate the release member 202 between its locked and unlocked positions. For example, as will be described below, in one embodiment, the electromechanical actuator 254 may correspond to one or more shape memory wires coupled between the release member 202 and a current source. In such an embodiment, when an electrical current is supplied through the shape memory wire(s), the wire(s) may apply a force against the release member 202 in the release direction 248 (e.g., via contraction of the wire(s)) that pulls the release member 202 from its locked position to its unlocked position. In another embodiment, the electromechanical actuator 254 may correspond to any suitable electrically driven piston-type actuator, such as a solenoid-activated piston that utilizes an electrical current to generate a magnetic field that retracts and/or extends the piston. In a further embodiment, the electromechanical actuator 254 may correspond to any other suitable electrically driven linear actuator, such as a linear motor or a screw-type actuator. For example, the electromechanical actuator 254 may include an electric motor mechanically connected to one or more components configured to convert the rotational output of the motor to linear motion, such as a lead screw/nut assembly, a worm gear-type assembly, a rack and pinion and/or the like.

Referring still to FIGS. 7 and 8, in one embodiment, a switch 256 (e.g., a dome switch) may be provided at an interface defined between the electronic module 158 and the frame 102 so as to provide an indication that the module 158 has been installed within its corresponding bay 142. For example, as shown in the illustrated embodiment, the switch 256 may be coupled to an inner surface 258 of the inwardly extending cavity 204 defined by the module housing 206. As such, when the retention member 200 is received within the cavity 204 as the electronic module 158 is being installed within its corresponding bay 142, the switch 256 may be compressed between the retention member 200 and the inner surface 258 of the cavity 204, thereby activating the switch 256. A suitable signal may then be transmitted to the processor(s) 182 of the electronic module 158 and/or to the frame controller 170 (e.g., via the data connection interfaces 118, 160, 162) to indicate that the electronic module 158 has been installed within the bay 142.

Figure 9:
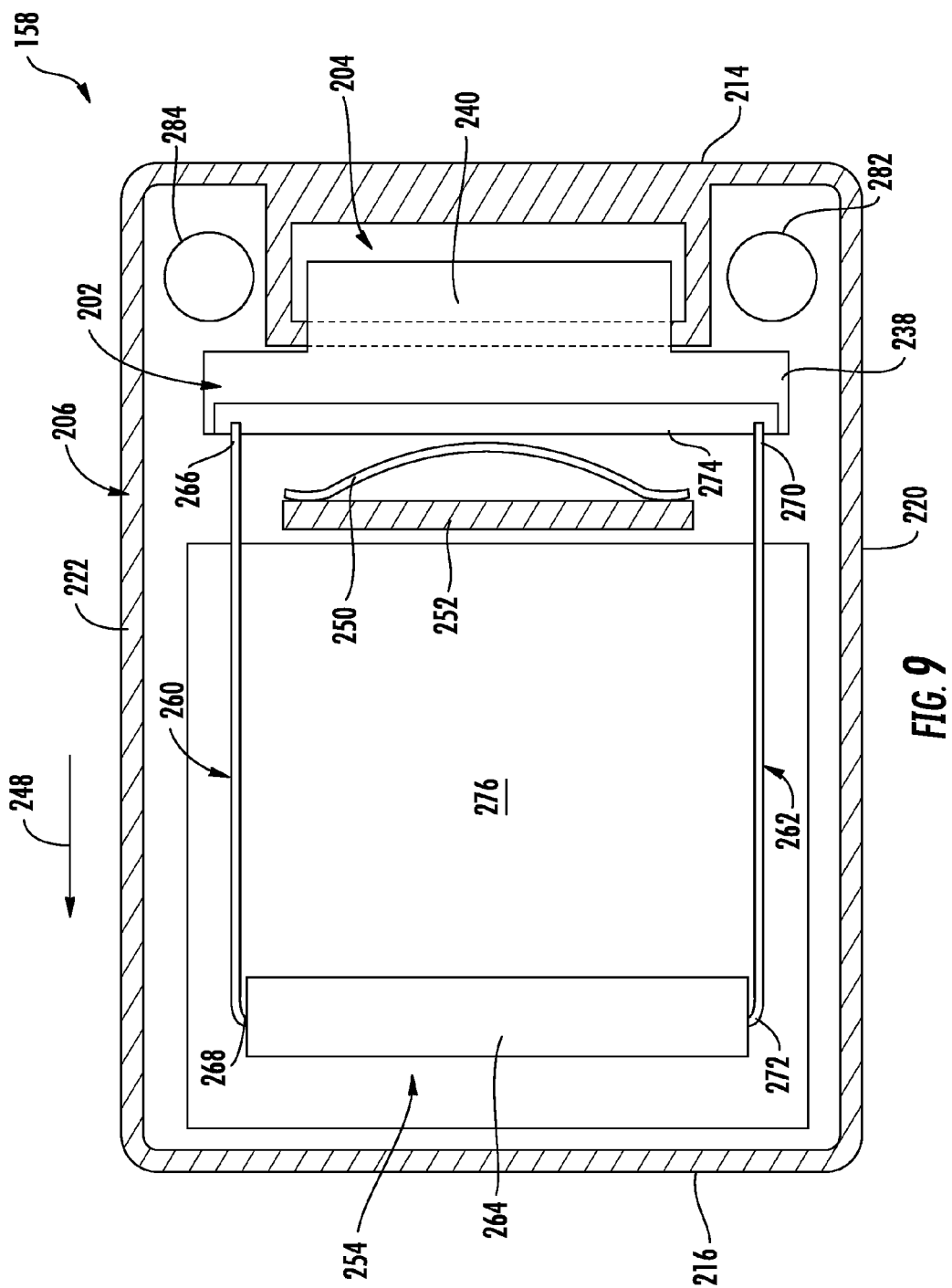
FIG. 9 illustrates an internal view of the electronic module shown in FIG. 6, particularly illustrating one embodiment of an electromechanical actuator that may be used to actuate the release member of the module between its locked and unlocked positions.

Referring now to FIG. 9, a simplified view of one embodiment of a suitable electromechanical actuator 254 that may be utilized to actuate the release member 202 between its locked and unlocked positions is illustrated in accordance with aspects of the present subject matter. Specifically, FIG. 9 illustrates an internal, bottom side view of the electronic module 158 shown in FIG. 6 with the lower wall 210 being removed to allow the various internal components of the module 158 to be shown and the various other walls of the module housing 206 being indicated by cross-hatching.

As shown in FIG. 9, the electromechanical actuator 254 may, in one embodiment, include first and second shape memory wires 260, 262 coupled between the release member 202 and a current source 264 disposed within the module housing 206. Specifically, the first shape memory wire 260 may be configured to extend lengthwise between a first end 266 and a second end 268, with the first end 266 being coupled to the release member 202 at a first location and the second end 268 being electrically coupled to the current source 264. Similarly, the second shape memory wire 262 may be configured to extend lengthwise between a first end 270 and a second end 272, with the first end 270 being coupled to the release member 202 at a second location and the second end 272 being electrically coupled to the current source 264. As shown in FIG. 9, to provide a continuous current path between the shape memory wires 260, 262, a conductive member 274 may be coupled to the release member 202 (e.g., the base portion 238 of the release member 202) that extends between the first and second locations so as to electrically couple the first end 266 of the first shape memory wire 260 to the first end 270 of the second shape memory wire 262. Alternatively, in the event that the release member 202 is formed from a conductive material, the release member 202 may, itself, provide a current path between the shape memory wires 260, 262. Additionally, as will be described below with reference to FIGS. 13-16, in one embodiment, separate conductive members may be coupled to the shape memory wires 260, 262 such that the conductive members/wires form part of an engagement detection circuit for the electronic module 158.

As shown in FIG. 9, the release member 202 may be normally in its locked position, with the biasing force applied by the biasing member 250 serving to push the release member outwardly in the direction of the cavity 204 defined by the module housing 206. To actuate the release member 202 to its unlocked position, an electrical current may be supplied through the shape memory wires 260, 262. For example, the current source 264 may be configured to supply an electrical current to the second end 268 of the first shape memory wire 260, which may then flow through the first shape memory wire 260 to the second shape memory wire 262 (e.g., through the conductive member 274) and back to the current source 264. As the electrical current is supplied through the shape memory wires 260, 262, the temperature of the wires 260, 262 may be increased, thereby causing the wires 260, 262 to contract or shorten in length. Such contraction of the wires 260, 262 may result in a force being applied to the release member 202 in the release direction (indicated by arrow 248 in FIG. 9) that overcomes the biasing force applied by the biasing member 250. As a result, the release member 202 may be pulled in the release direction 248 to its unlocked position, thereby disengaging the release member 202 from the retention member 200 contained within the cavity 204.

It should be appreciated that the current source 264 may generally correspond to any suitable component(s) of the electronic module 158 that is configured to supply an electrical current to the shape memory wires 260, 262. As shown in FIG. 9, in one embodiment, the current source 264 may correspond to a component of a printed circuit board 276 positioned within the module housing 206. In such an embodiment, the printed circuit board 276 may be configured to support the various internal electronic components of the module 158, such as the processor(s) 182, the memory 184 and/or any other suitable components.

It should also be appreciated that the shape memory wires 260, 262 may generally be formed from any suitable shape memory alloy that allows the wire(s) 260, 262 to function as described herein. For example, in one embodiment, the shape memory wires 260, 262 may be formed from a nickel-titanium alloy (also referred to as nitinol). In another embodiment, the shape memory wires 260, 262 may be formed from a copper-aluminum-nickel alloy, copper-zinc-aluminum alloy, iron-manganese-silicon alloy and/or any other suitable shape memory alloy.

Figure 10:
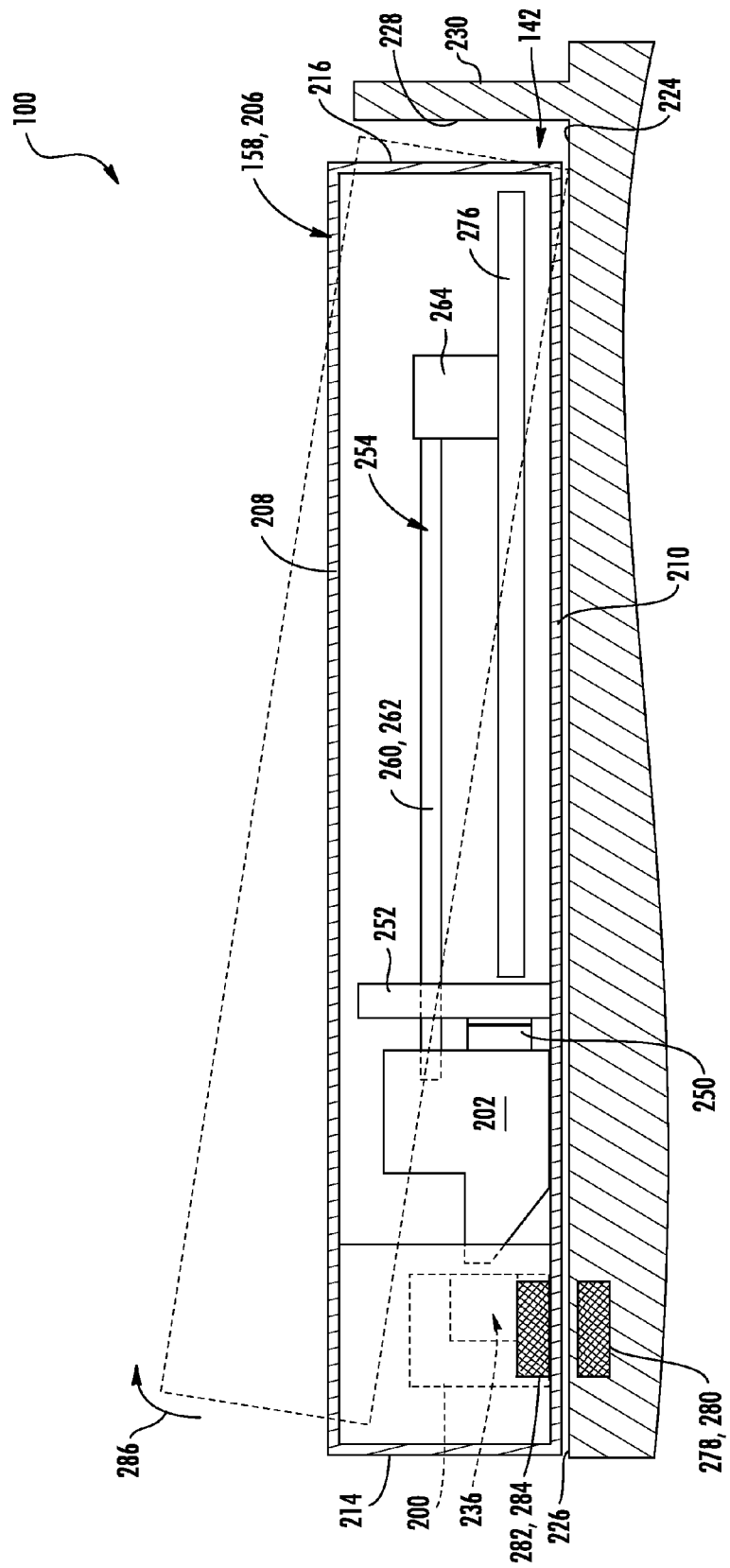
FIG. 10 illustrates a cross-sectional view of the portion of the modular electronic device shown in FIG. 5 taken about line 10-10, particularly illustrating the electronic module being pivoted outwardly from the frame (as indicated by the dashed lines) when the release member is moved to its unlocked position to allow the module to be removed from the frame.

Referring now to FIG. 10, a cross-sectional view of a portion of the modular electronic device 100 shown in FIG. 5 taken about line 10-10 is illustrated in accordance with aspects of the present subject matter. Specifically, FIG. 10 illustrates a lengthwise cross-sectional view of the electronic module 158 installed within its corresponding bay 142. In addition, FIG. 10 illustrates the electronic module 158 pivoted relative to the frame 102 (as indicated by the dashed lines) to facilitate removal of the electronic module 158 from the bay 142.

In several embodiments, the frame 102 and/or the electronic module 158 may include one or more biasing members configured to bias at least a portion of the module housing 206 in a direction away from the bottom wall or floor 224 of the bay 142 when the release member 202 is moved to its unlocked position, thereby causing the electronic module 158 to pivot outwardly relative to the frame 102. For example, in the illustrated embodiment, the frame 102 may include one or more bay magnets 278, 280 configured to repel one or more corresponding module magnets 282, 284 positioned within the module housing 206. Specifically, as shown in FIGS. 6 and 10, the frame 102 may include first and second bay magnets 278, 280 mounted within and/or adjacent to the bay floor 224, such as by positioning the bay magnets 278, 280 along either side of the retention member 200 at locations adjacent to the first end 226 of the bay floor 224. Similarly, as shown in FIGS. 6, 9 and 10, the electronic module 158 may include first and second module magnets 282, 284 mounted within and/or adjacent the lower wall 210 of the module housing 206, such as by positioning the module magnets 282, 284 along either side of the cavity 204 at locations adjacent to the first end 214 of the module housing 206. As such, when the release member 202 is moved to its unlocked position so as to disengage release member 202 from the retention member 200 (as indicated by the solid lines in FIG. 10), the repulsive magnetic force provided between the bay magnets 278, 280 and the module magnets 282, 282 may result in the first end 214 of the module housing 206 being biased or pushed outwardly such that the module housing 206 pivots (e.g., as indicated by arrow 286 in FIG. 10) away from the bay floor 224 about the opposed, second end 216 of the module housing 206 to an upward pivoted position (indicated by the dashed lines). The first end 214 of the module housing 206 may then be grasped by a user of the disclosed module electronic device 100 to quickly and easily remove the electronic module 158 from the frame 102.

It should be appreciated that, in other embodiments, the biasing member(s) 278, 280, 282, 284 may correspond to any other suitable component(s) and/or member(s) that is configured to apply a biasing force against the module housing 206 so as to bias the electronic module 158 outwardly relative to the frame 102 when the release member 202 is moved to its unlocked position. For instance, in alternative embodiment, the biasing member(s) may correspond to a spring or any other deformable or compressible element positioned between the module housing 206 and the frame 102.

In general, the present subject matter has been described herein with reference to the frame 102 including a fixed retention member 200 associated with each of its respective bays and each electronic module including a movable release member 202 configured to selectively engage its corresponding retention member 200. However, in other embodiments, the frame 102 may include a release member associated with each of its bays. In such an embodiment, each electronic module may include a suitable retention member configured to engage the release member provided in the bay within which the module is being installed.

Figure 11:
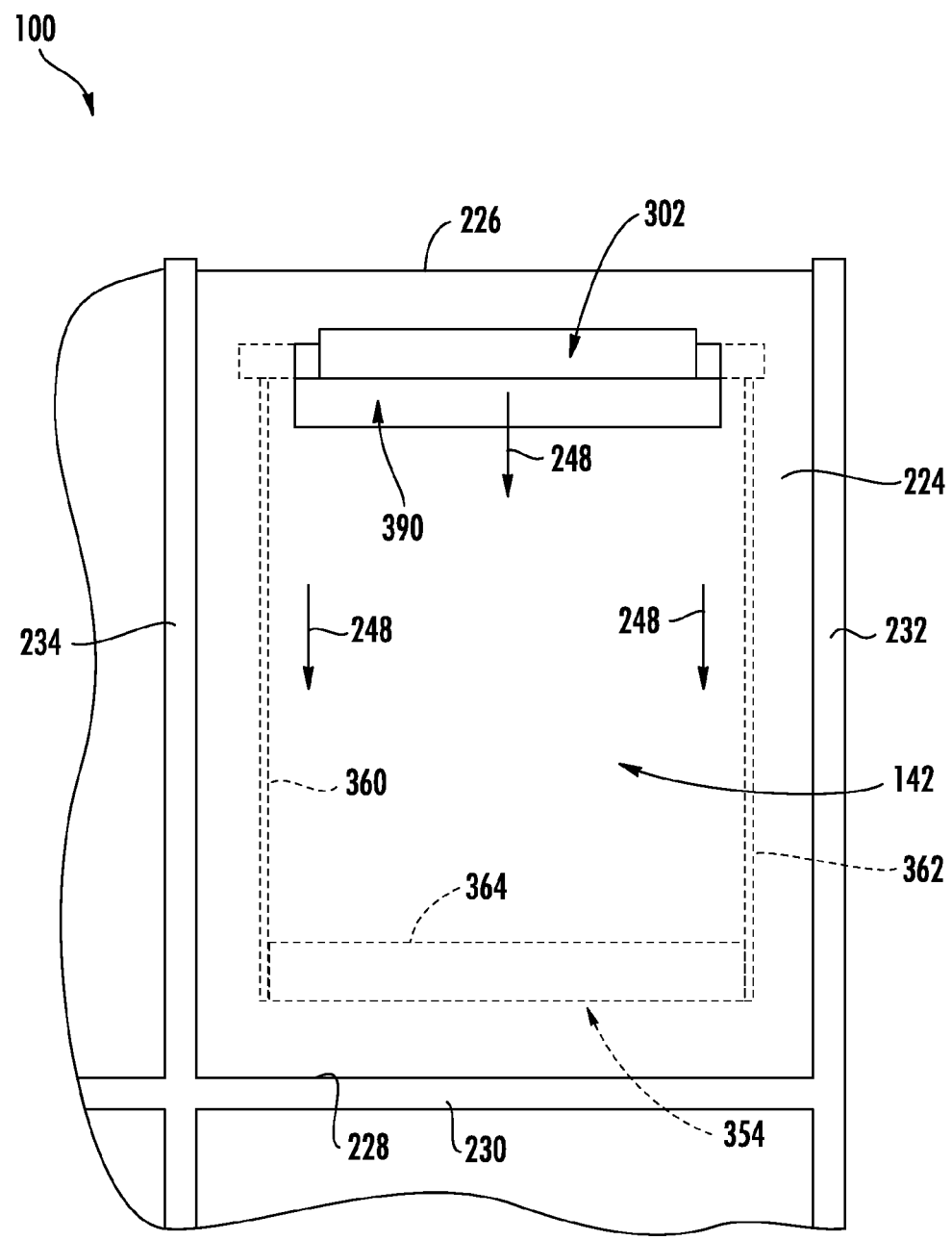
FIG. 11 illustrates an alternative embodiment of a portion of a modular electronic device configured in accordance with aspects of the present subject matter, particularly illustrating a top view of the bay shown in FIG. 6 in an embodiment in which the release member is associated with the frame as opposed to the electronic module.
Figure 12:
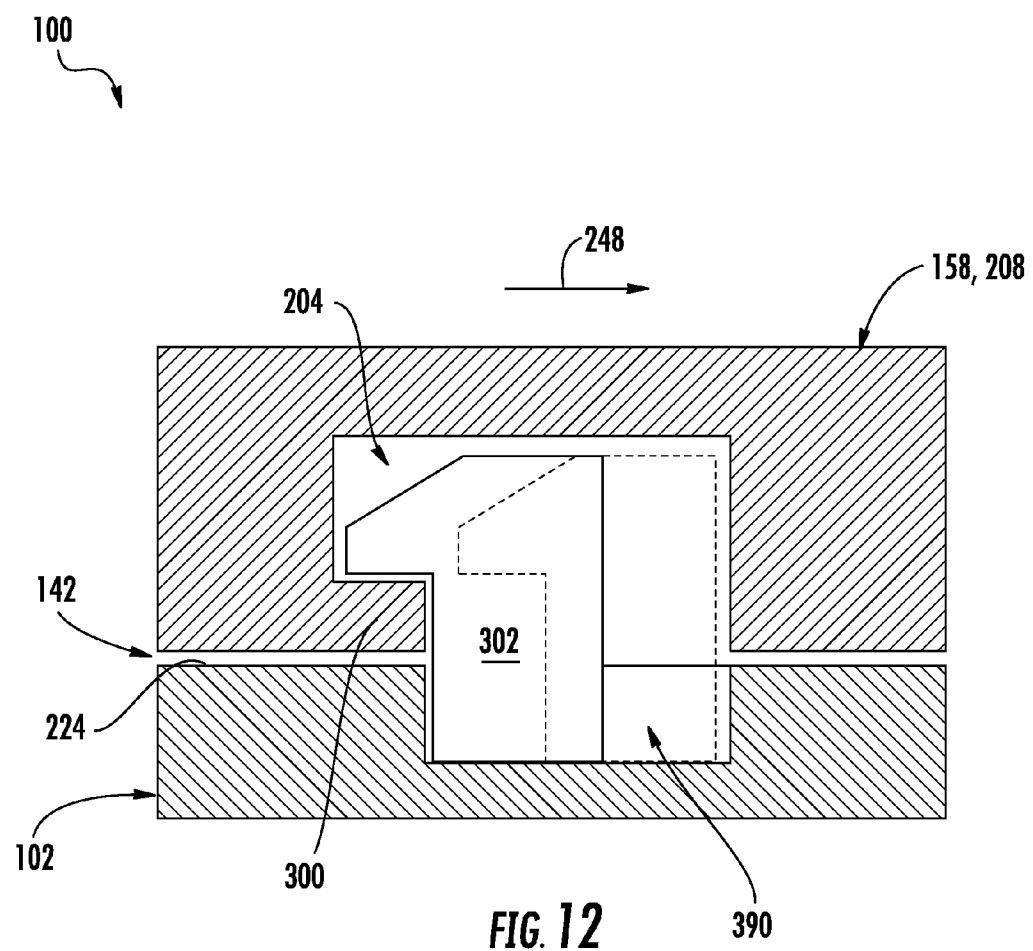
FIG. 12 illustrates a partial cross-sectional view of the bay shown in FIG. 11 with an electronic module being installed therein, particularly illustrating the release member associated with frame being moved relative to a retention member of the electronic module between a locked position (shown in solid lines) and an unlocked position (shown in dashed lines)

For example, FIGS. 11 and 12 illustrate an alternative embodiment of the modular electronic device 100 described above in which a release member 302 is provided in association with each bay and a corresponding retention member 300 is provided in association with each electronic module. Specifically, FIG. 11 illustrates a top view of the bay 142 shown in FIG. 6 after being reconfigured to incorporate a suitable release member 302. Additionally, FIG. 12 illustrates a partial cross-sectional view of the electronic module 158 shown in FIG. 6 installed within the bay 142 shown in FIG. 11, particularly illustrating the module 158 after being reconfigured to include a suitable retention member 300.

As shown in FIGS. 11 and 12, the release member 302 may be movably coupled to the frame 102 within a slot 390 defined in the bottom wall or floor 224 of the bay 142. Specifically, in several embodiments, the release member 302 may be configured to be moved within the slot 390 relative to the frame 102 between a locked position (indicated by the solid lines in FIG. 12) and unlocked position (indicated by the dashed lines in FIG. 12). As shown in FIG. 12, when in the locked position, the release member 402 may be configured to extend outwardly from the slot 390 into the cavity 204 defined by the module housing 206 so as to engage the corresponding retention member 300 of the electronic module 158 (e.g., a retention lip formed by the module housing 206 that extends into the cavity 204), thereby retaining the electronic module 158 relative to the frame 102. However, by moving the release member 302 in the release direction (indicated by arrows 248 in FIGS. 11 and 12) within the slot 390 from the locked position to the unlocked position, the release member 302 may be disengaged from the retention member 300. As such, the electronic module 158 may be removed from the frame 102.

Additionally, in several embodiments, an electromechanical actuator 354 (shown in dashed lines in FIG. 11) may be housed within the frame 102 that is configured to actuate the release member 302 between its locked and unlocked positions. For example, as shown in FIG. 11, similar to the embodiment described above with reference to FIG. 10, the electromechanical actuator 354 may include one or more shape memory wires (indicated by dashed lines 360, 362) coupled between the release member 302 and a corresponding current source (indicated by dashed box 364). As such, when an electrical current is supplied through the shape memory wire(s) 360, 362, the wire(s) 360, 362 may contract, thereby pulling release member 302 in the release direction 248 away from the retention member 300.

It should also be appreciated that the frame 102 and/or the electronic module 158 shown in FIGS. 11 and 12 may also include any other suitable retention/release features to assist in retaining the module 158 within the bay 142 and/or to accommodate removing the module 158 from the bay 142. For instance, similar to the biasing member 250 described above with reference to FIGS. 7-9, a spring or any other suitable biasing member may be provided within the frame 102 to apply a biasing force against the release member 302 that biases the release member 302 into the locked position. Additionally, similar to the biasing members 278, 280, 282, 284 described above with reference to FIG. 10, one or more magnets or any other suitable biasing member(s) may be provided within the frame 102 and/or the electronic module 158 to bias the module 158 away from the frame 102 when the release member 302 is moved to its unlocked position, thereby facilitating removal of the module 158 from the bay 142.

Figure 13:
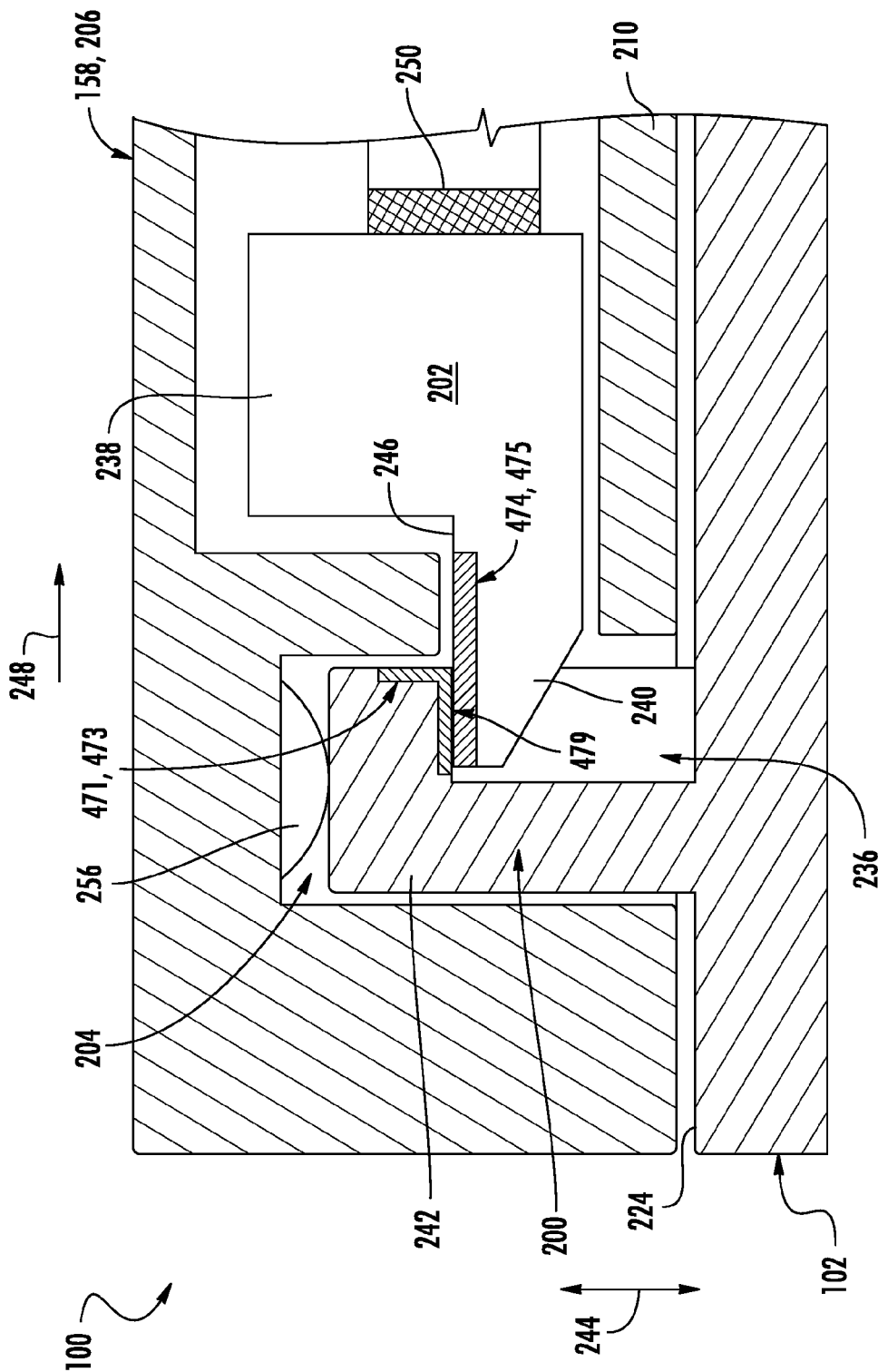
FIG. 13 illustrates a cross-sectional view of an alternative embodiment of the modular electronic device 100 shown in FIG. 7 in accordance with aspects of the present subject matter, particularly illustrating both the frame and the electronic module of the device including components of an engagement detection circuit.
Figure 14:
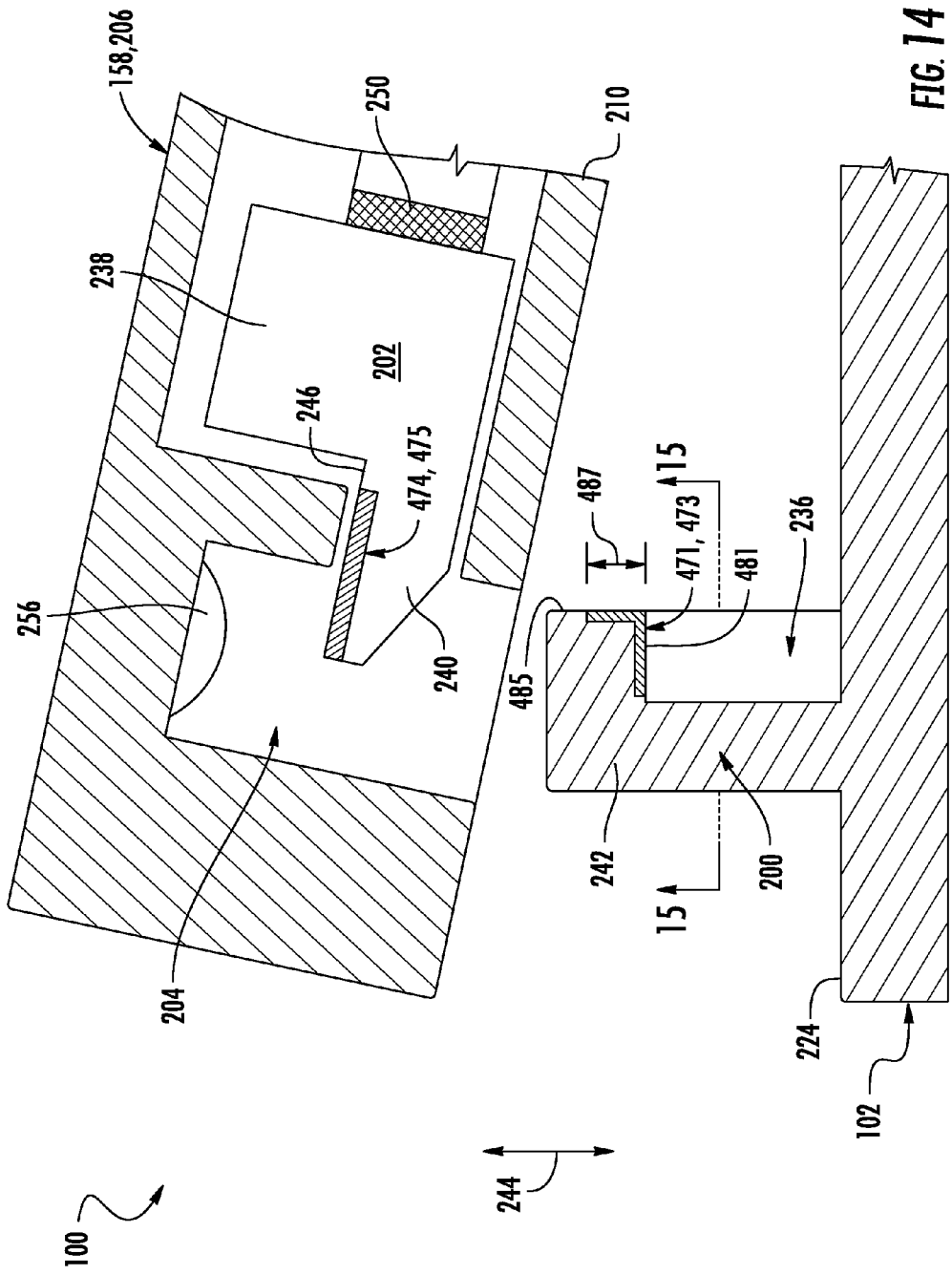
FIG. 14 illustrates a cross-sectional view of the frame and the electronic module shown in FIG. 13 after the module has been pivoted outwardly relative to the frame.
Figure 15:
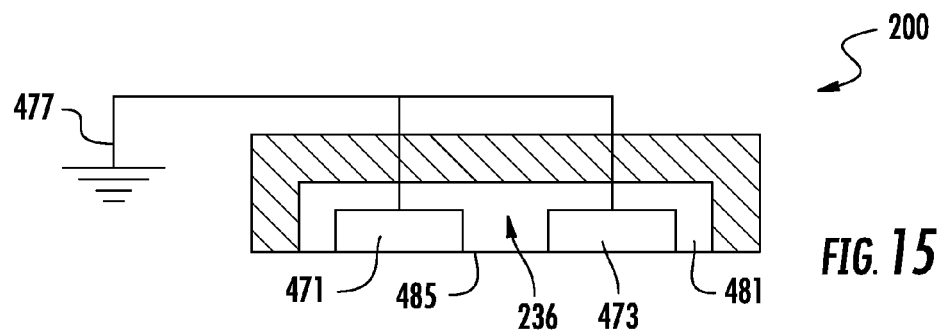
FIG. 15 illustrates a cross-sectional view of a portion of a retention member of the frame shown in FIG. 14 taken about line 15-15, particularly illustrating first and second ground members of the retention member.
Figure 16:
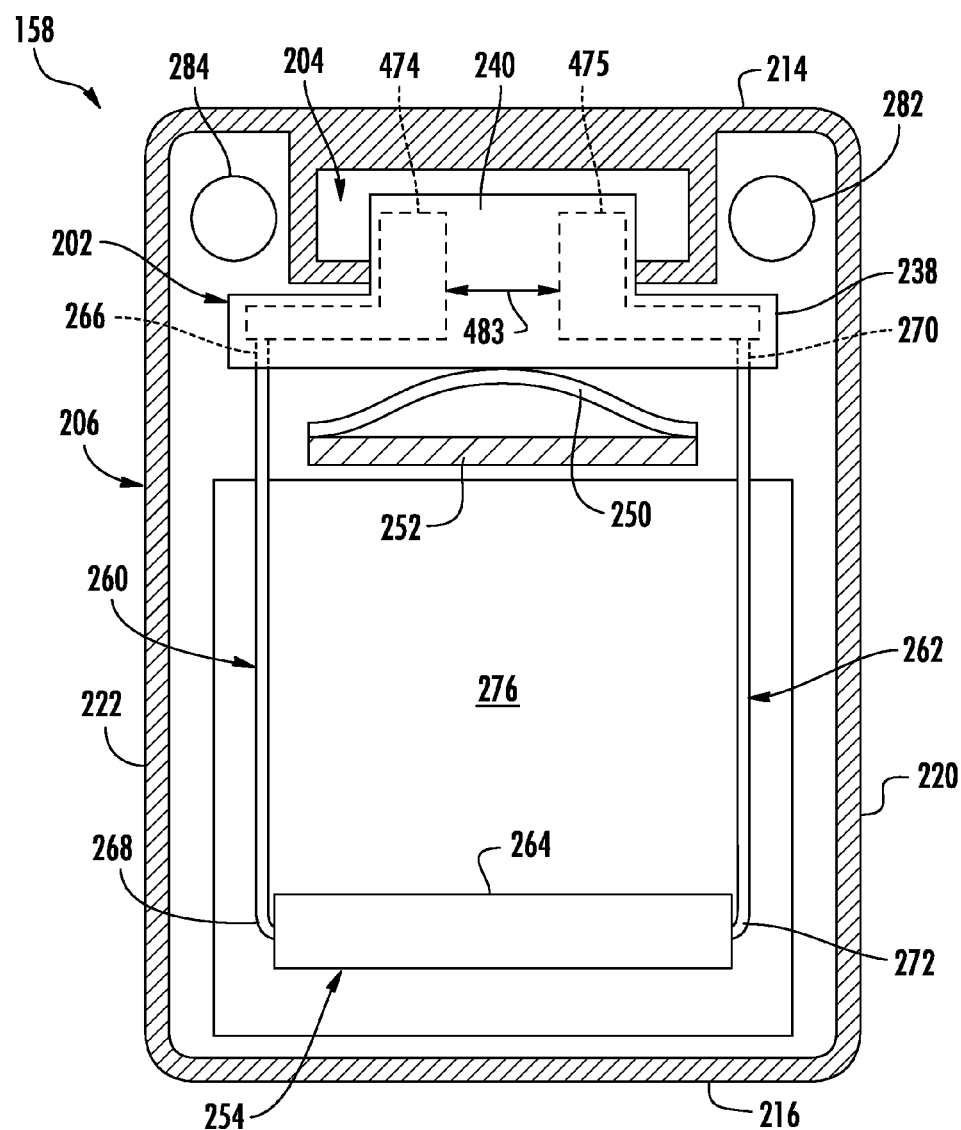
FIG. 16 illustrates an internal view of the electronic module shown in FIG. 13, particularly illustrating first and second contact members provided in operative association with a release member of the electronic module.

Referring now to FIGS. 13-16, several views of an alternative embodiment of the modular electronic device 100 are illustrated in accordance with aspects of the present subject matter, particularly illustrating the device 100 incorporating components of an engagement detection circuit. Specifically, FIG. 13 illustrates a cross-sectional view of the modular electronic device 100 similar to that shown in FIG. 7, particularly illustrating the frame 102 and the electronic module 158 both including components of the engagement detection circuit. FIG. 14 illustrates a cross-sectional view of the frame 102 and the electronic module 158 shown in FIG. 13 after the module 158 has been pivoted outwardly relative to the frame 102. FIG. 15 illustrates a cross-sectional view of a portion of the retention member 200 shown in FIG. 14 taken about line 15-15. Additionally, FIG. 16 illustrates an internal, bottom side view of the electronic module 158 shown in FIG. 13 with the lower wall 210 being removed to allow the various internal components of the module 158 to be shown and the various other walls of the module housing 206 being indicated by cross-hatching.

As shown in the illustrated embodiment, to form the engagement detection circuit, the retention member 200 may include one or more ground members 471, 473 and the release member 202 may include one or more corresponding conductive members 474, 475. For instance, as particularly shown in FIG. 15, the retention member 200 may include a first ground member 471 and a second ground member 473, with each of the first and second ground members 471, 473 being electrically coupled to a ground terminal 477 via a common conductive path. Additionally, as shown in FIG. 16, the release member 202 may include a first conductive member 474 and a second conductive member 475, with the first and second conductive members 474, 475 being electrically coupled to the first and second shape memory wires 260, 262, respectively. The shape memory wires 260, 262 may, in turn, be coupled to the current source 264. For instance, the first end 266 of the first shape memory 260 wire may be electrically coupled to the first conductive member 474 and the second end 268 of the first shape memory wire 260 may be electrically coupled to the current source 264. Similarly, the first end 270 of the second shape memory wire 262 may be electrically coupled to the second conductive member 475 and the second end 272 of the second shape memory 262 wire may be electrically coupled to the current source 264. In such an embodiment, when the release member 202 is at the locked position, the first conductive member 474 may be configured to electrically contact the first ground member 471 and the second conductive member 475 may be configured to electrically contact the second ground member 473, thereby forming a closed electrical circuit. As a result, an electrical current may be supplied through the closed circuit to allow the shape memory wires 260, 262 to be contracted and apply a force against the release member 202 in the release direction (indicated by arrow 248 in FIG. 13) to disengage the release member 202 from the retention member 200. However, as the release member 202 is disengaged from the retention member 200 and the electronic module pivots 158 outwardly relative to the frame 101, the electrical contact between the ground members 471, 473 and the conductive members 474, 475 is lost, thereby opening the electrical circuit and preventing further activation of the shape memory wires 260, 262.

In several embodiments, at least a portion of each of the ground members 471, 473 and at least a portion of each of the conductive members 474, 475 may be configured to be positioned at the engagement interface 479 (FIG. 13) defined between the retention member 200 and the release member 202 when the release member 202 is at its locked position, thereby allowing each conductive member 474, 475 to electrically contact its corresponding ground member 471, 473. For instance, as shown in FIGS. 13 and 14, the conductive members 474, 475 are incorporated within or otherwise coupled to the release member 202 such that each conductive member 474, 475 forms all or part of the section of the outer surface 246 of the engagement portion 240 of the release member 202 that is configured to contact or otherwise engage the outer portion 242 of the retention member 200 at the engagement interface 479. Similarly, as shown in FIGS. 13 and 14, the ground members 471, 473 may be incorporated within or otherwise coupled to the retention member 202 such that each ground member 471, 473 forms all or part of an inner surface 481 (FIGS. 14 and 15) of the outer portion 242 of the retention member 200 that is configured to contact or otherwise engage the engagement portion 240 of the release member 202 at the engagement interface 479. As such, when release member 202 is positioned in its locked position relative to the retention member 202, an electrical connection may be provided between each corresponding pair of ground members 471, 473 and conductive members 474, 475.

It should be appreciated that the first and second conductive members 474, 475 may be positioned on the release member 202 so as to be electrically isolated from one another. For instance, as shown in FIG. 16, the conductive members 474, 475 may be spaced apart from one another on the release member 202 by a lateral distance 483.

Additionally, in one embodiment, the ground members 471, 473 may be configured to wrap or extend around the outer portion 242 of the retention member 200 such that at least a portion of each ground member forms all or part of a side surface 485 (FIGS. 14 and 15) of the outer portion 242 generally oriented in the retention direction (indicated by arrow 244 in FIGS. 13 and 14) of the electronic module 158. For instance, as shown in FIGS. 13 and 14, the ground members 471, 473 may have an "L-shaped" cross-section such that a portion of each ground member 471, 473 extends along the inner surface 481 of the outer portion 242 of the retention member 200 and another portion of each ground member 471, 473 extends along the side surface 485 of the outer portion 242. As such, when the release member 202 is disengaged from the retention member 200 and the electronic module 158 pivots outwardly relative to the frame 102, the electrical connection between the conductive members 474, 475 and the ground members 471, 473 may be maintained temporarily as the conductive members 474, 475 slide upwardly across the side surface 485 of the outer portion 242 of the retention member 200 in the retention direction 244. By temporarily maintaining the electrical connection as the electronic module 158 pivots outwardly relative to the frame 102, it can be ensured that the release member 202 has cleared the retention member 200 and that the electronic module 158 is completely unlatched from the frame 102 prior to opening the electrical circuit and deactivating the shape memory wires 260, 262.

Each ground member 471, 473 may generally be configured to extend along the side surface 485 of the outer portion 242 in the retention direction 244 any suitable distance. For instance, as shown in FIG. 14, each ground member 471, 473 extends along the side surface 485 of the outer portion 242 a distance 487 equal to about 75% of the total length of the side surface 485. However, in other embodiments, the distance 487 may correspond to any other suitable length, such as less than 75% of the total length of the side surface 485 or greater than 75% of the total length of the side surface 485. For instance, in a particular embodiment of the present subject matter, each ground member 471, 473 may extend along the side surface 485 across its entire length.

As indicated above, the present subject matter is also directed to a method for assembling an electronic module configured for use with a modular electronic device, such as the modular electronic device 100 described above. In general, various aspects of the assembly method will be described herein with reference to FIGS. 17-23. In addition, a flow diagram of one embodiment of a method for assembling an electronic module will be described below with reference to FIG. 24. It should be appreciated that, for purposes of discussion, the various aspects of the disclosed method will be described with reference to assembling an embodiment of the electronic module 158 described above with reference to FIGS. 5-10. However, it should be appreciated that the disclosed method may generally be utilized to assemble any suitable electronic module.

Figure 17:
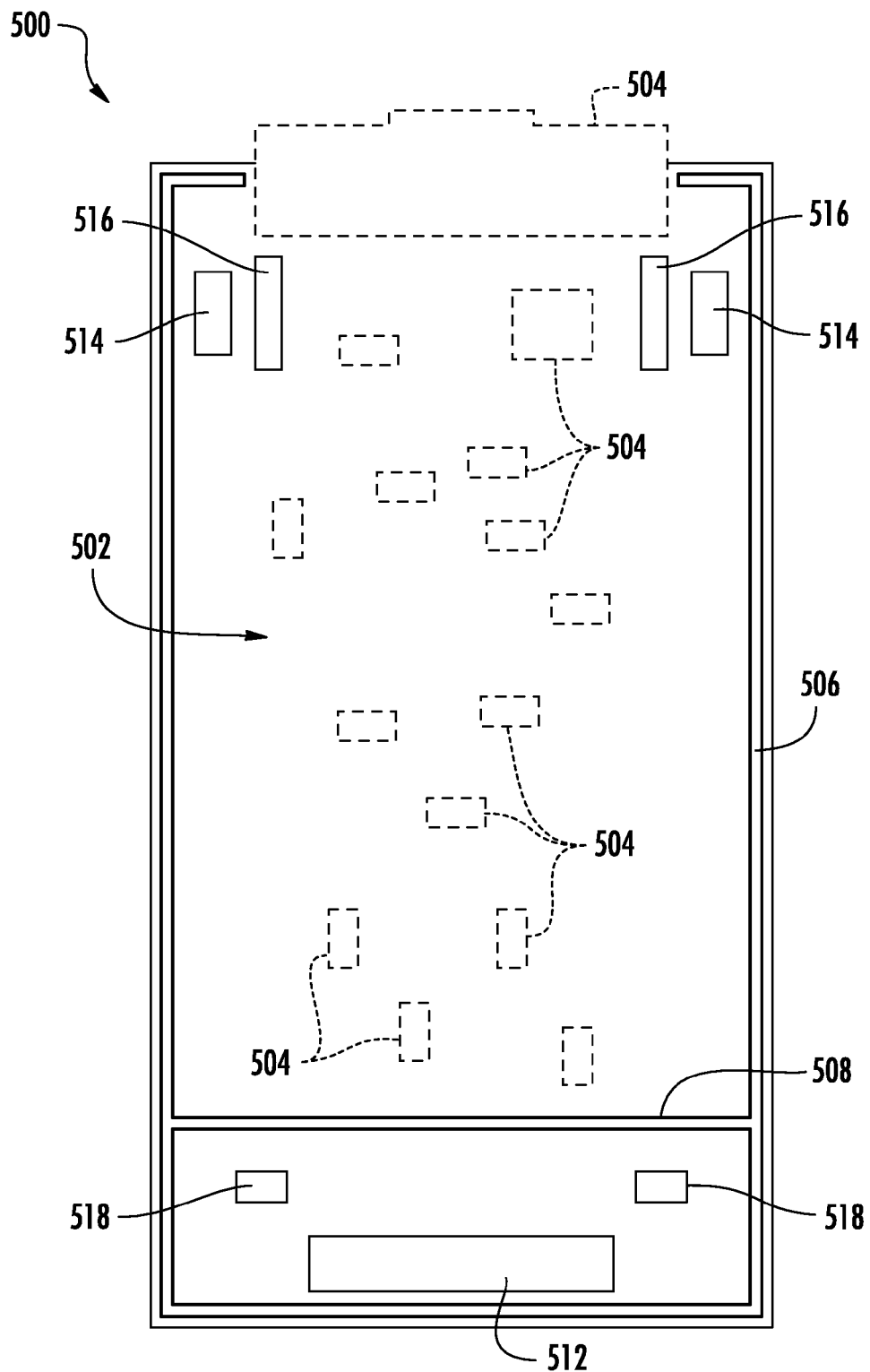
FIG. 17 illustrates a bottom view of one embodiment of a printed circuit board assembly that may be utilized within an electronic module in accordance with aspects of the present subject matter.

In several embodiments, the assembly method may utilize a completed printed circuit board (PCB) assembly as a stand-alone, structural component, with the electronic module being constructed from the PCB assembly outward. For example, FIG. 17 illustrates a bottom view of one embodiment of a suitable configuration for a PCB assembly 500 that may be utilized within an electronic module, such as the electronic module 158 shown in FIGS. 5-10. As shown in FIG. 17, the PCB assembly 500 may include a PCB 502 forming the primary structural component of the assembly 500. Initially, one or more of the internal components of the electronic module 158 (indicated by dashed boxes 504) may be mounted to one or both sides of the PCB 502 (e.g., using surface-mount technology) to form the PCB assembly 500. As is generally understood, the PCB 502 may include a plurality of solder pads on its surface(s) that are positioned at the desired locations of the internal components 504. The internal components 504 may then be placed on the solder pads along with solder paste and conveyed through a reflow soldering oven (or provided in operative association with any other suitable device configured to implement a soldering process) to secure the internal components 504 to the PCB 502. Such internal component 504 may include, but, are not limited to, one or more processors (e.g., the processor(s) 182 shown in FIG. 4), memory elements (e.g., the memory 184 shown in FIG. 4), storage interfaces, power connectors, data connectors, and/or the like.

Additionally, the PCB 502 may also include solder pads 506, 508 for coupling one or more additional components of the electronic module 158 to the PCB 502. For instance, as shown in FIG. 17, a first solder pad 506 may be provided around an outer perimeter of the PCB 502. As will be described below, the first solder pad 506 may be used to couple a first housing or shield component 510 of the electronic module 158 to the PCB 502. Additionally, as shown in FIG. 17, a second solder pad 508 may be provided on the PCB 502 that extends across its width. As will be described below, the second solder pad 502 may be used, for example, to couple one or more other components of the electronic module 158 to the PCB 502, such as the internal wall 252 of the electronic module 158 described above.

Moreover, one or more openings or slots may also be defined through the PCB. For example, as shown in FIG. 17, the PCB 502 may define an elongated slot 512 for receiving or accommodating the retention member 200 of the frame 102. Specifically, as will be described below, when the electronic module 158 is assembled, the elongated slot 512 defined through the PCB 502 may be configured to be aligned with the cavity 204 defined in the module housing 206. As such, when the retention member 200 is received within the cavity 204, the retention member 200 may also extend at least partially through the elongated slot 512 defined in the PCB 502. Additionally, the PCB 502 may include a pair of contactor openings 514, a pair of anti-rotation slots 516, and a pair of fixture openings 518. As will be described below, these opening/slots 514, 516, 518 may be utilized when installing the various components of the electromechanical actuator 254 of the electronic module 158 relative to the PCB 502.

Figure 18:
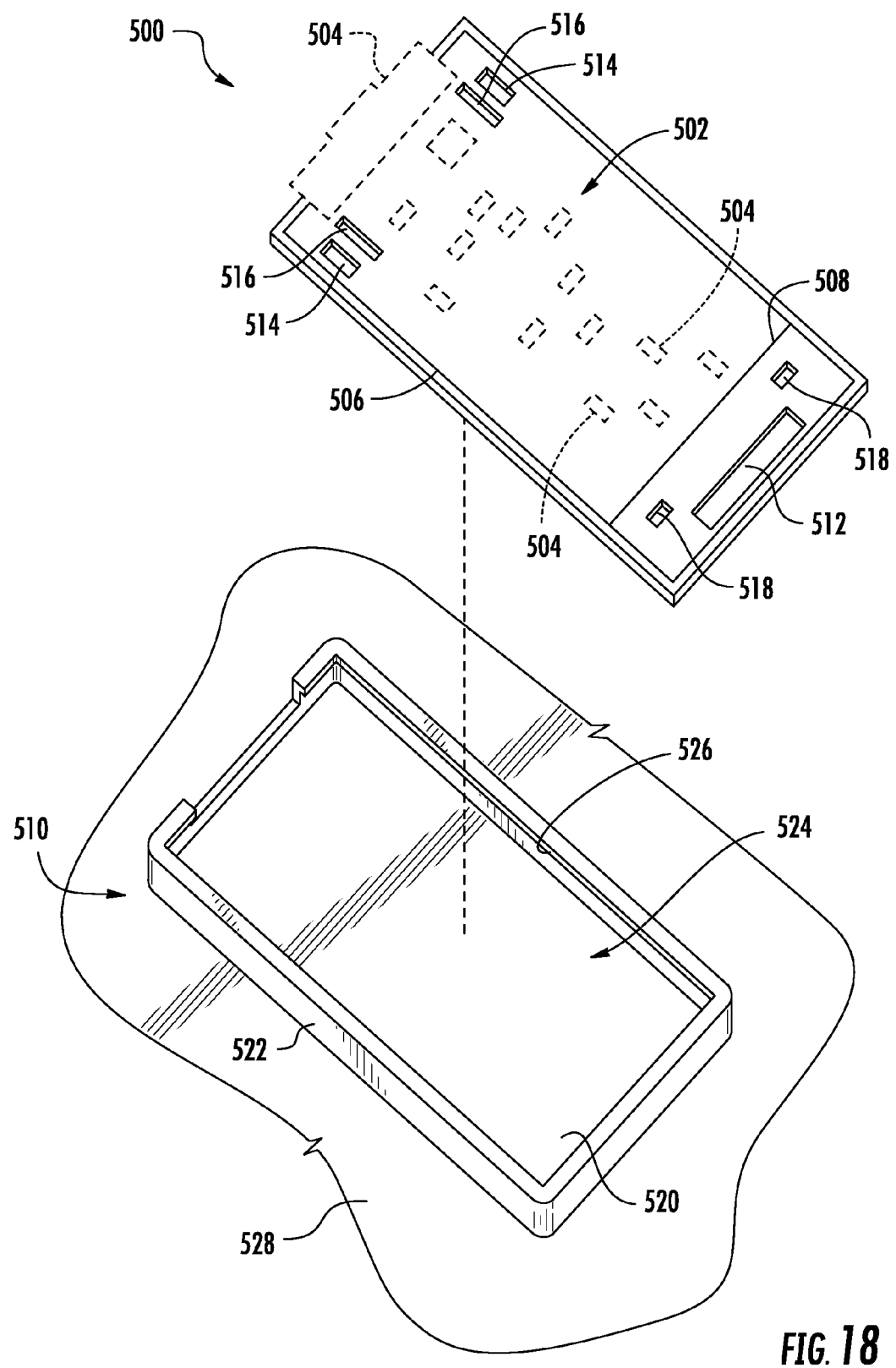
FIG. 18 illustrates a bottom perspective view of the printed circuit board assembly shown in FIG. 17 exploded away from one embodiment of a first shield component suitable for use with the electronic module in accordance with aspects of the present subject matter.

By initially mounting all of the various internal components 504 of the electronic module 158 to the PCB 502, the resulting PCB assembly 500 may generally correspond to a completed surface-mounted assembly. The completed PCB assembly 500 may then be coupled to a suitable housing or shield component configured to form a portion of the module housing 206 of the electronic module 158. For example, FIG. 18 illustrates a bottom perspective view of the completed PCB assembly 500 exploded away from a first shield component 510 (e.g., a shield fence) configured to be coupled to the PCB assembly 500 to form a top portion of the module housing 206. Specifically, in one embodiment, the first shield component 510 may include an outer wall 520 corresponding to the upper wall 208 of the module housing 206 described above with reference to FIG. 5. As such, the outer wall 520 may be configured to define the upper surface of the electronic module 158 (e.g., the portion of the outer surface that is visible when the module 158 is installed within its corresponding bay 142). Additionally, as shown in FIG. 18, the first shield component 510 may include a sidewall 522 extending outwardly around the perimeter of the outer wall 520 that defines an open cavity 524 for receiving a portion of the PCB assembly 500. Moreover, the first shield component 510 may also include an attachment lip 526 extending inwardly from the sidewall 522.

As shown in FIG. 18, during the assembly process, the first shield component 510 may be positioned on a support fixture/plate or any other suitable support surface 528. The PCB assembly 500 may then be positioned on top of the first shield component 510 such that the PCB 502 is properly positioned relative to the shield component 510 above the support surface 528. Thereafter, the first shield component 510 may be secured to the PCB assembly 500 (e.g., using surface mount technology). For example, solder may be dispensed between the first solder pad 506 on the PCB 502 and the attachment lip 526 of the shield component 510. The components may then be conveyed through a reflow soldering oven (or provided in operative association with any other suitable device configured to implement a soldering process) to securely attach the first shield component 510 to the PCB assembly 500.

Figure 19:
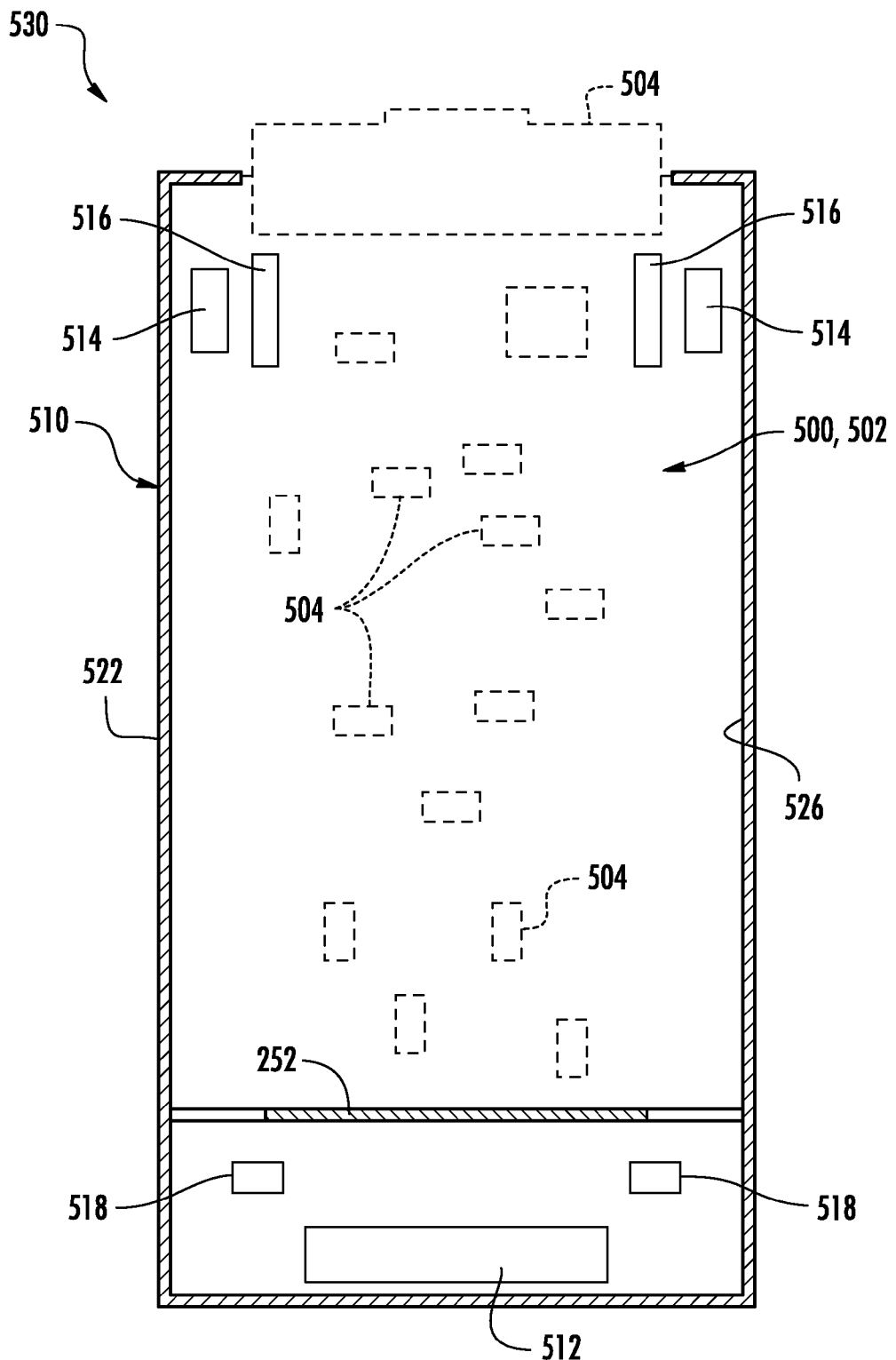
FIG. 19 illustrates a bottom, assembled view of the printed circuit board assembly and the first shield component shown in FIG. 18.

Referring now to FIG. 19, a bottom view of a partial assembly 530 of the electronic module 158 after the first shield component 510 has been secured to the PCB assembly 500 is illustrated in accordance with aspects of the present subject matter. As shown, the first shield component 510 may be mounted relative to the PCB assembly 500 such that the attachment lip 526 of the shield component 510 overlaps the PCB 502 around its outer edges, thereby allowing the lip 526 to extend over the first solder pad 506 provided on the PCB 502. Additionally, as shown in FIG. 19, the internal wall 252 of the electronic module 158 may also be mounted to the PCB 502 along the second solder pad 508. It should be appreciated that, for purposes of illustration and to distinguish the various components of the partial assembly 530, the first shield component 510 and the internal wall 252 have been shown with cross-hatching.

It should be appreciated that, in addition to the first shield component 510 and the internal wall 252, various other components may also be mounted to or otherwise positioned relative to the PCB assembly 502 during this stage of the assembly process. For instance, one or more insulation components, spacers, dampers and/or other components may be positioned between the PCB 502 and the first shield component 510 and/or adjacent to the interface defined between the PCB 502 and the shield component 510. Alternatively, such components may be incorporated into first shield component 510. For instance, in one embodiment, the first shield component 510 may be formed from a metallic material having a polymer material over-molded onto portions of the metallic material to form one or more insulation components, spacers, and/or dampers along such portions of the shield component 510.

Figure 20:
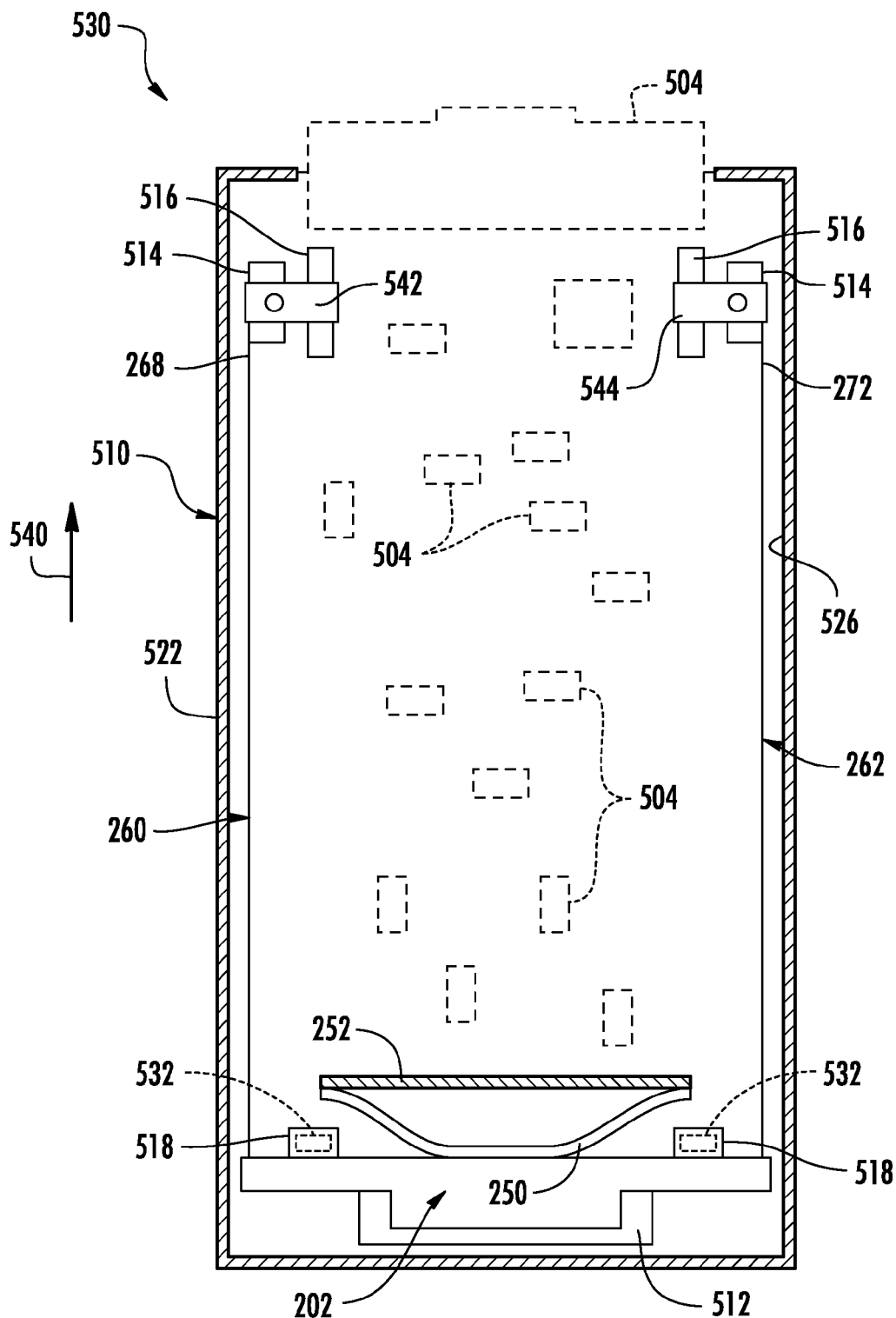
FIG. 20 illustrates another bottom view of the assembly shown in FIG. 19, particularly illustrating various additional components installed relative to the printed circuit board assembly in accordance with aspects of the present subject matter.

Referring now to FIG. 20, after mounting the first shield component 510 to the PCB assembly 500, one or more of the components configured to serve as a retention/release feature(s) for the electronic module 158 may be installed relative to the PCB assembly 500. Specifically, in several embodiments, the release member 202 of the electronic module 158 may be initially installed relative to the PCB 502, with the shape memory wires 260, 262 being installed thereafter. For example, as shown in FIG. 20, the release member 202 may be positioned on the PCB 502 adjacent to the elongated slot 512. In addition, the biasing member 250 may be installed between the release member 202 and the internal wall 252.

After installation of the release member 202 and the biasing member 250, the end of each shape memory wire 260, 262 located opposite the release member 202 (e.g., the seconds ends 268, 272 of the wires 260, 262) may be pulled in a tensioning direction (indicated by arrow 540 in FIG. 20) away from the release member 202 to tension the wire 260, 262. During such wire tensioning, the release member 202 may be held in position relative to the remainder of the PCB assembly 502. For example, as shown in FIG. 20, one or more fixture components (indicated by dashed boxes 532) may be inserted through the fixture openings 518 to allow the fixture components 532 to prevent the release member 202 from moving in the tensioning direction 540 as the shape memory wires 260, 262 are being tensioned. In one embodiment, the fixture components 532 may be configured to retain the release member 202 in its locked position relative to the PCB assembly 502 as the wires 260, 262 are being tensioned. The tensioned wires 260, 262 may then be mounted to the PCB 502 such that the wires 260, 262 are electrically coupled to a suitable current source (not shown). It should be appreciated that the initial placement of the release member 202 may allow for the shape memory wires 260, 262 to be independently tensioned when coupling the wires 260, 262 to the PCB 502.

In several embodiments, the shape memory wires 260, 262 may be configured to be coupled to the PCB 502 using suitable contactors 542, 544 (e.g., crimp contacts). For example, a first contactor 542 may be provided to couple the first shape memory wire 260 to the PCB 502 and a second contactor 544 may be provided to couple the second shape memory wire 262 to the PCB 502. In such an embodiment, each contactor 542, 544 may be secured to the PCB 502 at one of the contactor openings 514. For instance, a screw or other fastener may be used to couple each contactor 542, 544 to the PCB 502 at each respective contactor opening 514. Additionally, a portion of each contactor 542, 544 may be configured to be received within the adjacent anti-rotation slot 518 to prevent rotation of the contactor 542, 544. In such an embodiment, the anti-rotation slots 518 may also be configured to serve as press-fit slots for use with initial tensioning of the wires 260, 262 and for positioning the contactors 542, 544 relative to the PCB 502.

Figure 21:
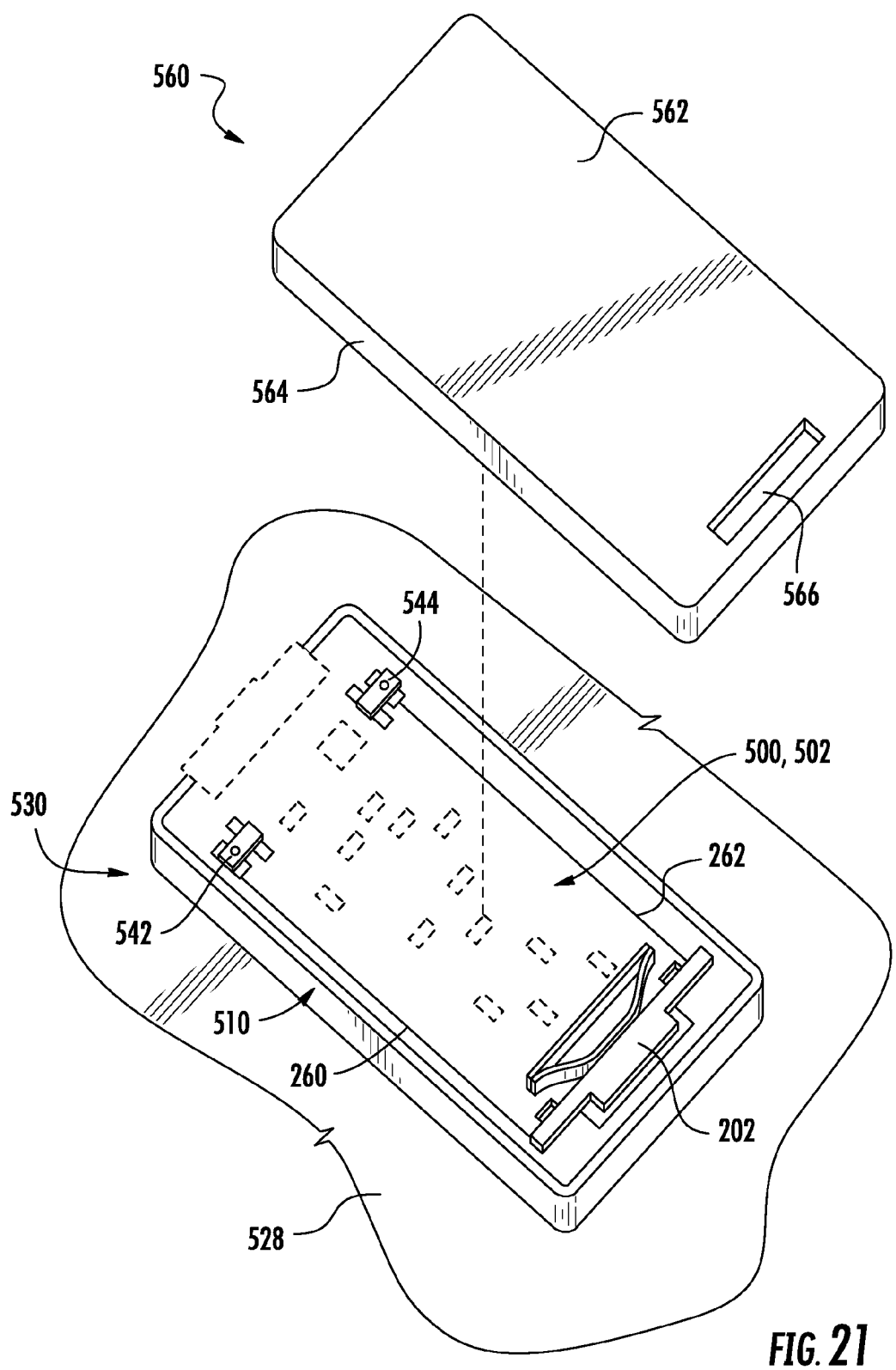
FIG. 21 illustrates a bottom perspective view of the assembly shown in FIG. 20 with one embodiment of a second shield component exploded away from the assembled components in accordance with aspects of the present subject matter.
Figure 22:
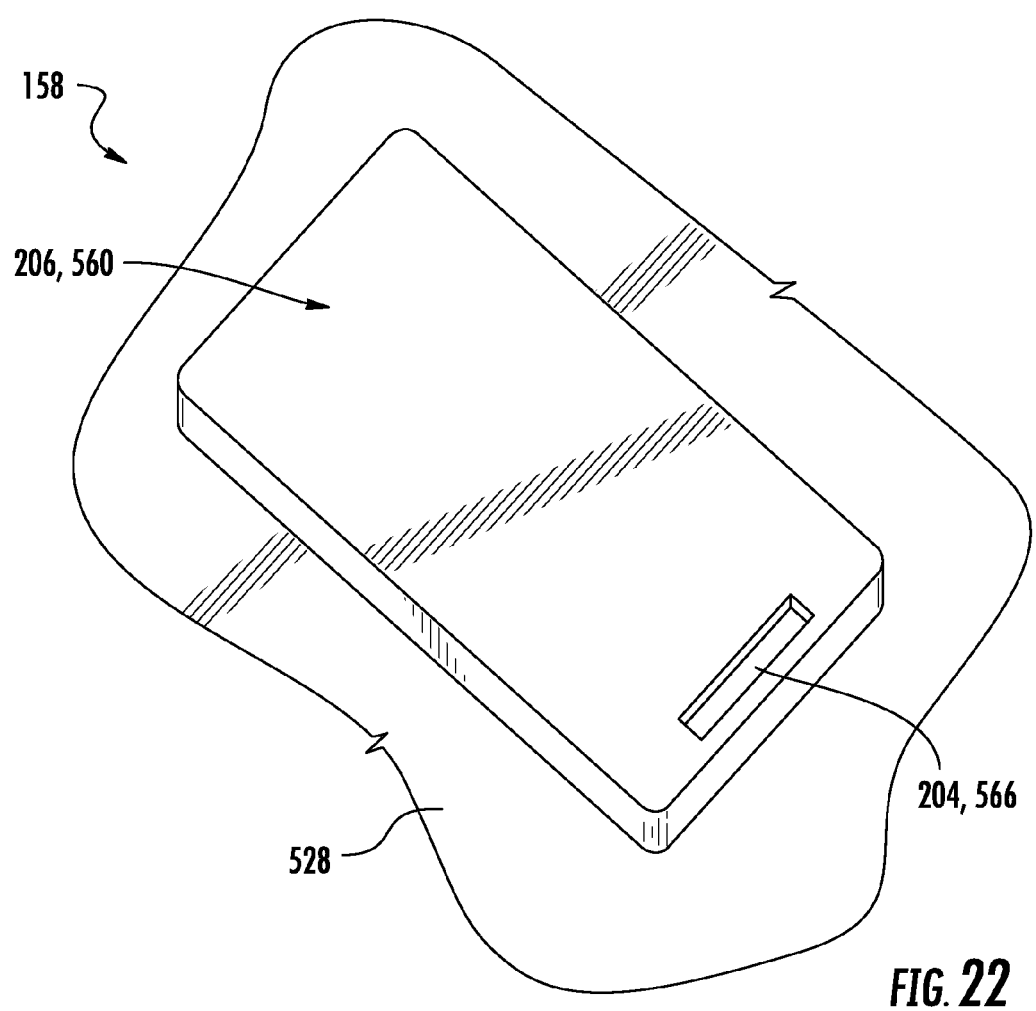
FIG. 22 illustrates a bottom, fully assembled view of the electronic module components shown in FIG. 21.

Following installation of the components of the electro-mechanical actuator 254, the remainder of the module housing 206 may be installed to complete the assembly of the electronic module 158. For example, FIG. 21 illustrates a bottom perspective view of both the partial assembly 530 shown in FIG. 20 and a second shield component 560 (e.g., a shield can) configured to be coupled to the assembly 530 so as to form the remainder of the module housing 206, with the second shield component 560 being exploded away from the partial assembly 530. In several embodiments, the second shield component 560 may include an outer wall 562 corresponding to the lower wall 210 of the module housing 206 described above with reference to FIG. 6. As such, the outer wall 562 may be configured to define the lower surface of the electronic module 158. Additionally, as shown in FIG. 21, the second shield component 562 may include a sidewall 564 extending outwardly around the perimeter of the outer wall 565 that defines an open cavity (not shown) for receiving at least a portion of the partial assembly 530. In one embodiment, the sidewall 564 may generally be configured to define the first and second ends 214, 216 (FIG. 6) of the module housing 206 as well as the first and second sides 220, 222 (FIG. 6) of the housing 206. Moreover, as shown in FIG. 21, the second shield component 562 may also define a cavity opening 566 generally corresponding to the cavity 204 of the module housing 206.

In several embodiments, the second shield component 560 may be configured to be coupled to the first shield component 510 so that the PCB assembly 500 is fully encased between the first and second shield components 510, 560. For instance, in one embodiment, the second shield component 560 may be snapped into place relative to the first shield component 510. In such an embodiment, the sidewall 564 of the second shield component 560 may be configured to extend over and be coupled to a portion of the sidewall 522 of the first shield component 510. Alternatively, the second shield component 560 may be coupled to the first shield component 510 in any other suitable manner that allows the PCB assembly 500 to be positioned between the first and second shield components 510, 560. A bottom perspective view of the assembled electronic module 158 is shown in FIG. 21 after the second shield component 560 has been coupled to the first shield component 510.

Figure 23:
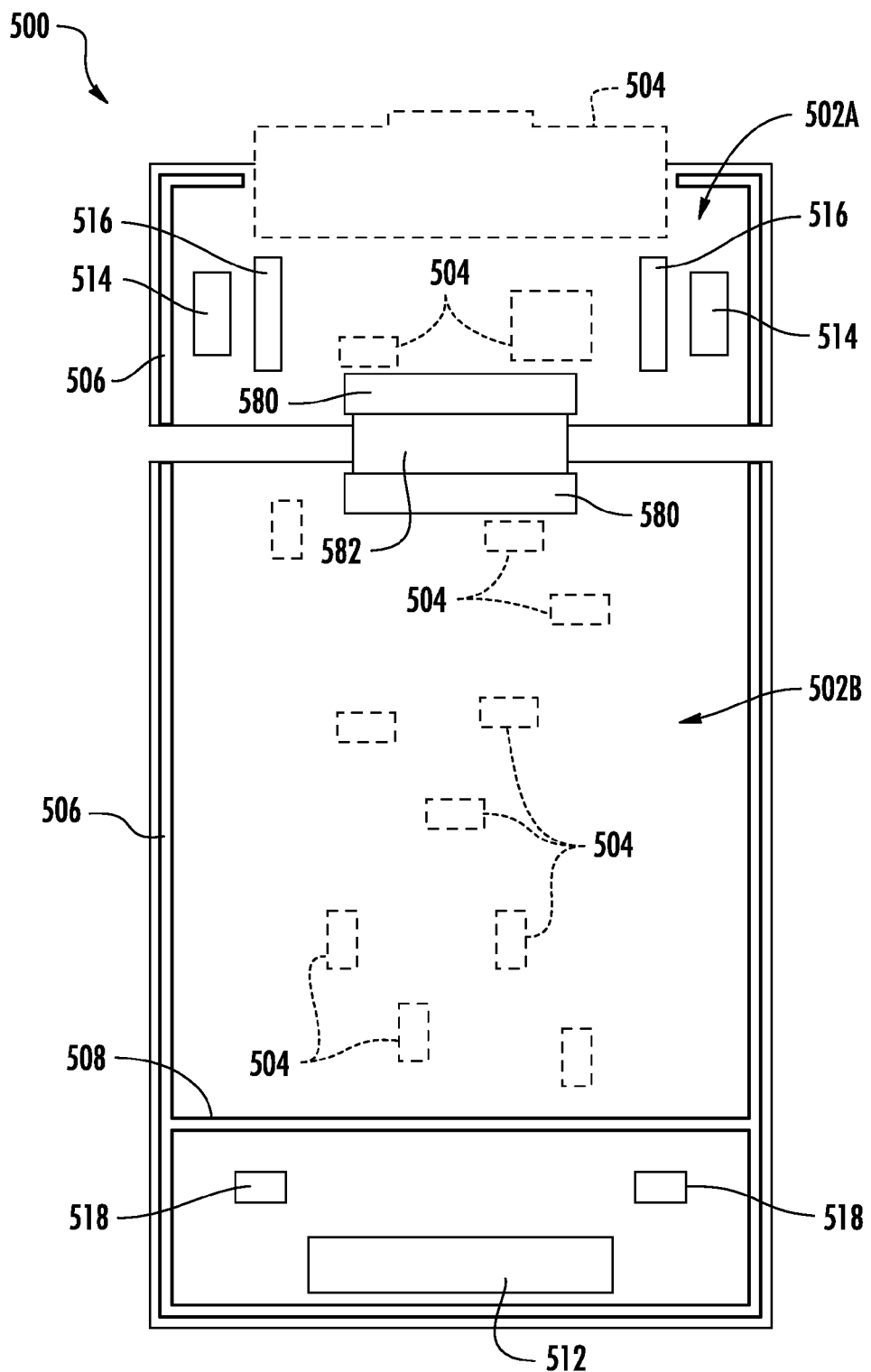
FIG. 23 illustrates a bottom view of another embodiment of a printed circuit board assembly that may be utilized within an electronic module in accordance with aspects of the present subject matter, particularly illustrating the printed circuit board assembly including two printed circuit boards.

It should be appreciated that, as opposed to including a single PCB 502, the PCB assembly 500 of each electronic module may, instead, include two or more PCBs 502 coupled to one another to form the completed PCB assembly 500. For instance, FIG. 23 illustrates a bottom view of one embodiment of a PCB assembly 500 including two PCBs 502A, 502B, namely a first PCB 502A and a second PCB 502B. In such an embodiment, the internal components of the electronic module 158 (indicated by dashed boxes 504) may be mounted to one or both sides of each PCB 502A, 502B (e.g., using surface-mount technology). Additionally, in one embodiment, the PCBS 502A, 502B may be configured similarly to the PCB 502 described above with reference to FIG. 17. For instance, first solder pads 506 may be provided around the outer perimeters of the PCBs 502A, 502B for coupling the first shield component 510 to each PCB 502A, 502B. As shown in FIG. 23, a second solder pad 508 may also be provided on the second PCB 502B that extends across its width for coupling one or more other components of the electronic module 158 to the PCB 502B. Moreover, one or more openings or slots may also be defined through one or both of the PCBs 502A, 502B. For example, as shown in FIG. 23, the second PCB 502B may define both an elongated slot 512 for receiving or accommodating the retention member 200 of the frame 102 and a pair of fixture openings 518 for receiving suitable fixture components during the assembly process. Similarly, the first PCB 502A may include a pair of contactor openings 514 and a pair of anti-rotation slots 516 that may be used with corresponding contactors 542, 544 for coupling the shape memory wires 260, 262 to the PCB 502A.

In the illustrated embodiment, prior to assembling the shield components 510, 560 relative to the PCB assembly 500, the first and second PCBs 502A, 502B may be coupled to one another. For example, as shown in FIG. 23, each PCB 502A, 502B may include a board-to-board (BTB) connector 580. In such an embodiment, a flexible printed circuit (FPC) 582 may be coupled between the adjacent BTB connectors 580 to connect the first PCB 502A to the second PCB 502B. The use of the FPC 582 may allow for stresses causes due to any misalignment between the BTB connectors 580 to be alleviated. Alternatively, the PCBs 502A, 502B may be coupled to one another using any other suitable means.

Once the PCBs 502A, 502B have been coupled to one another to complete the PCB assembly 500, the electronic module 158 may be assembled the same as or similar to that described above with reference to FIGS. 18-22. For instance, the PCB assembly 500 may then be positioned on top of the first shield component 510 to allow the shield component 510 to be coupled to the PCB assembly 500. Thereafter, the various components of the electromechanical actuator 254 may be installed relative to the PCB assembly 500. Moreover, upon installation of such components, the second shield component 560 may installed relative to the first shield component 510 such that the PCB assembly 500 is encased between the first and second shield components 510, 560.

Figure 24:
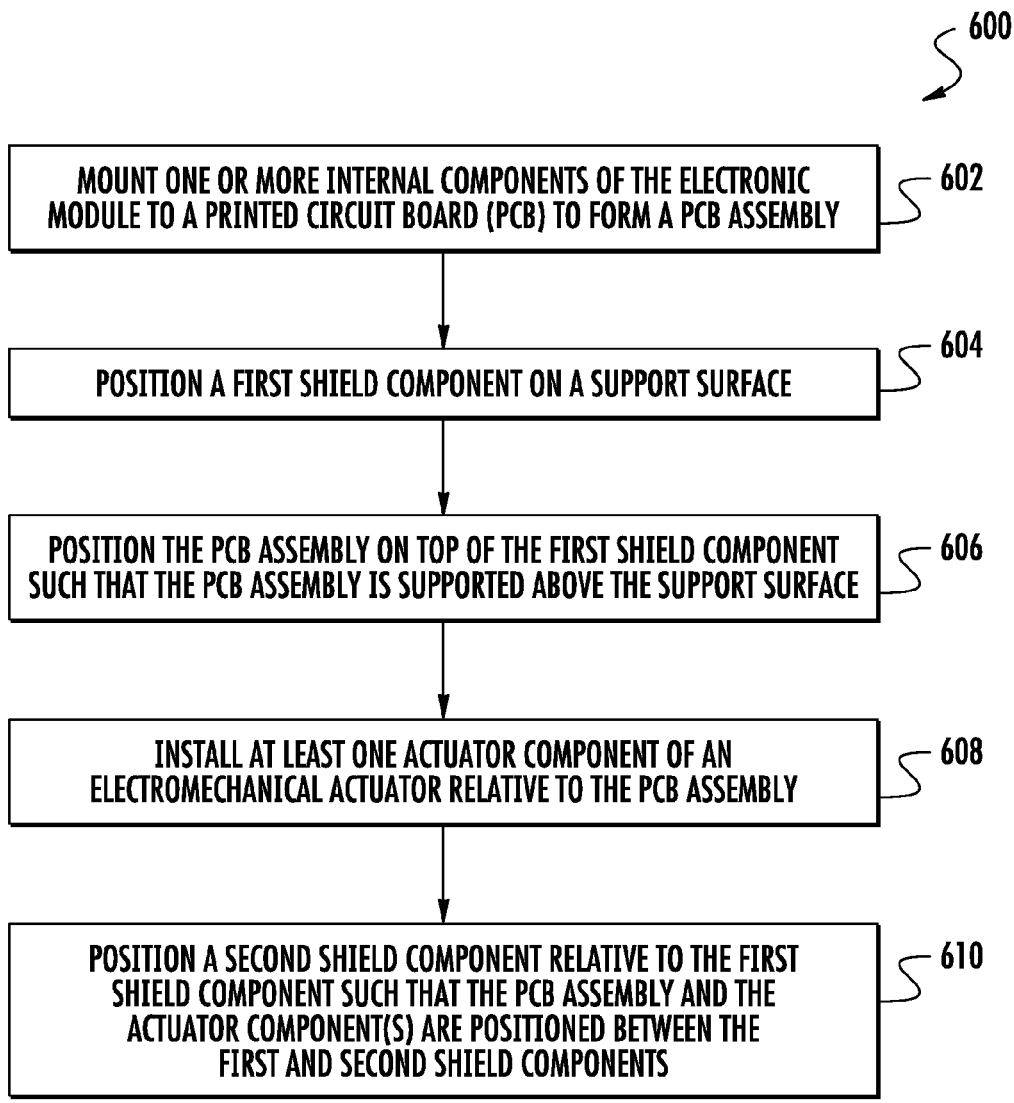
FIG. 24 illustrates a flow diagram of one embodiment of a method for assembling an electronic module suitable for use with a modular electronic device in accordance with aspects of the present subject matter.

Referring now to FIG. 24, a flow diagram of one embodiment of a method 600 for assembling an electronic module configured for use with a modular electronic device is illustrated in accordance with aspects of the present subject matter. In general, the method 600 will be described herein with reference to the assembly method described above with reference to FIGS. 17-23. However, one skilled in the art, using the disclosures provided herein, will appreciate that various steps of the methods disclosed herein can be omitted, rearranged, combined, and/or adapted in various ways without deviating from the scope of the present disclosure. For instance, the disclosed method 600 may be modified to allow for the assembly of electronic modules that do not require the separate installation of specific components of an electromechanical actuator.

As shown in FIG. 24, at (602), the method 600 includes mounting one or more internal components of the electronic module to a printed circuit board (PCB) to form a PCB assembly. For example, as indicated above, various internal components configured for use within an electronic module may be mounted or otherwise coupled to a PCB using surface-mount technology to form a complete, surface-mounted assembly. Additionally, at (604) and (606), the method 600 includes positioning a first shield component on a support surface and positioning the PCB assembly on top of the first shield component such that the PCB assembly is supported above the support surface. For example, as indicated above, the PCB assembly may be positioned on top of the first shield component to allow the first shield component to be mounted to the PCB assembly (e.g., using a soldering process).

Moreover, as shown in FIG. 24, at (608), the method 600 includes installing at least one actuator component of an electromechanical actuator relative to the PCB assembly. For instance, as indicated above, shape memory wires may be installed relative to the PCB assembly along with a corresponding release member. Further, at (610), the method 600 includes positioning a second shield component relative to the first shield component such that the PCB assembly and the actuator component(s) are positioned between the first and second shield components. For example, as described above, the first and second shield components may be coupled together such that the PCB assembly and the actuator component(s) are encased between the shield components.

Figure 25:
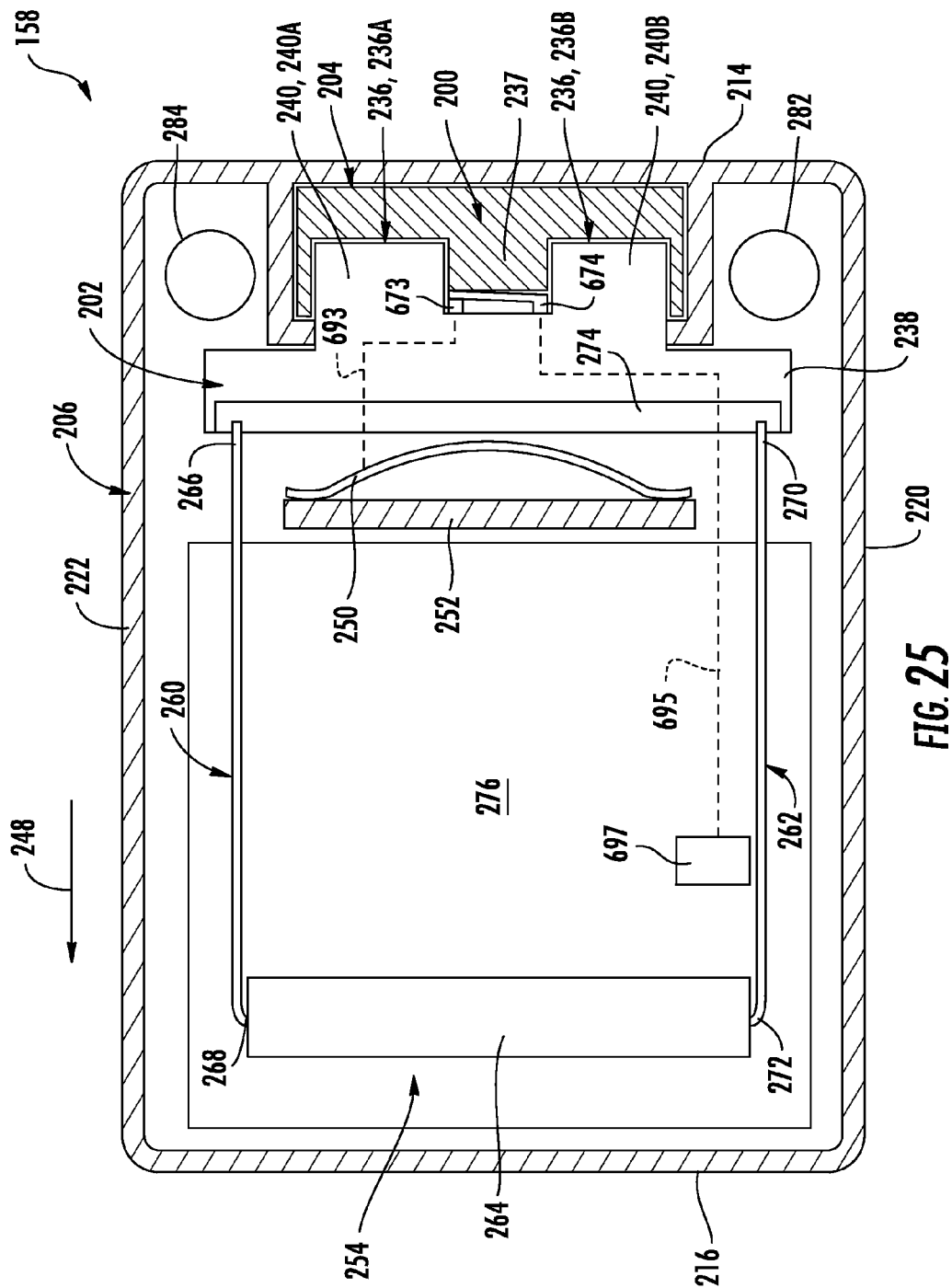
FIG. 25 illustrates an alternative embodiment of the electronic device shown in FIG. 9 in accordance with aspects of the present subject matter, particularly illustrating the electronic module including components of an engagement detection circuit.
Figure 26:
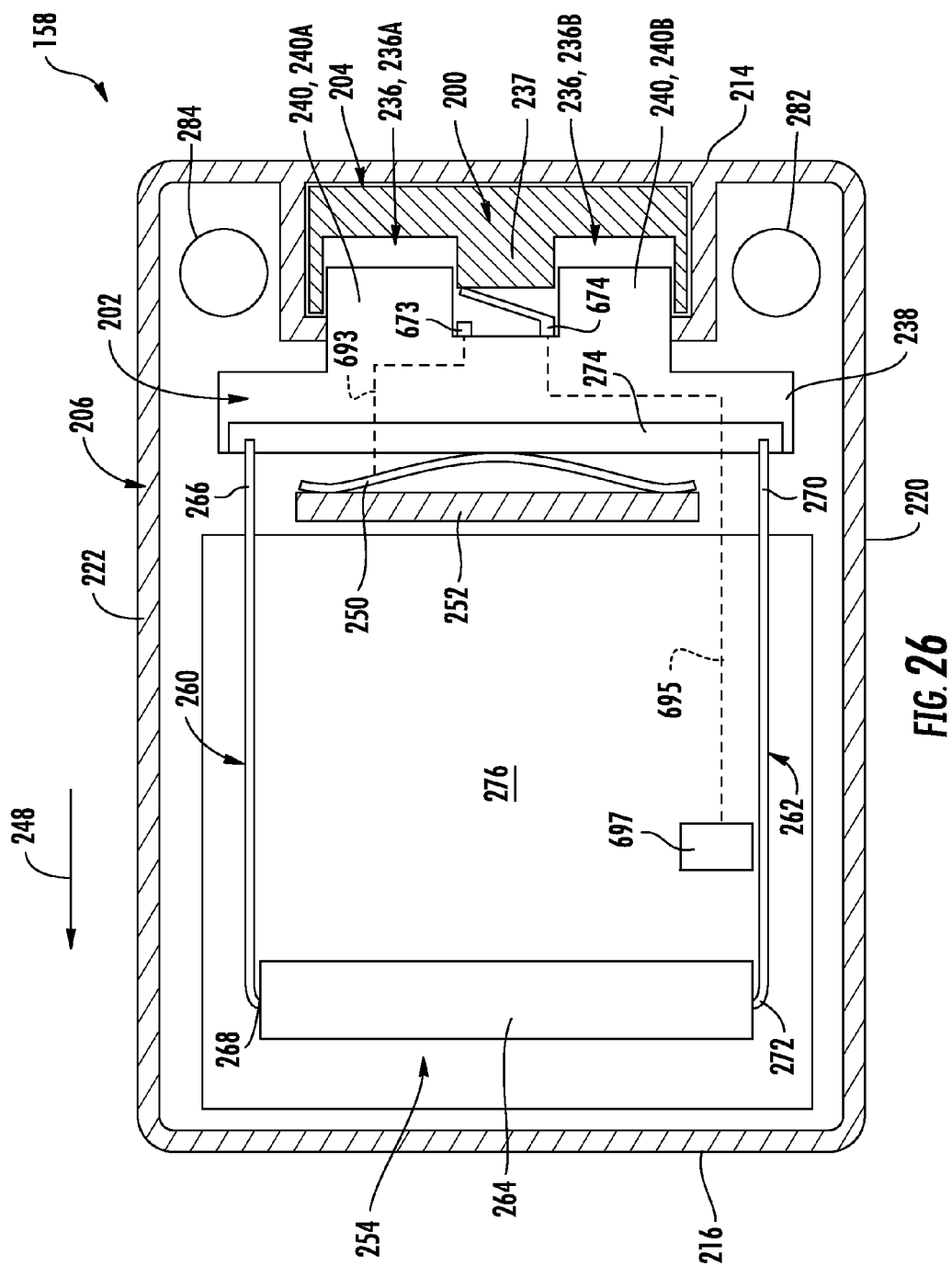
FIG. 26 illustrates another view of the electronic device shown in FIG. 25, particularly illustrating the engagement detection circuit in an opened position.

Referring now to FIGS. 25 and 26, another embodiment of the electronic module 158 shown in FIG. 9 is illustrated in accordance with aspects of the present subject matter, particularly illustrating the retention member 200 being received within the cavity 204 defined by the module 158. Specifically, FIG. 25 illustrates the release member 202 in its locked position relative to the retention member 200. Additionally, FIG. 26 illustrates the release member 202 moved away from the retention member 200 in the release direction 248 as the electromechanical actuator 254 is being used to actuate the release member 202 to its unlocked position. Moreover, FIGS. 25 and 26 illustrate portions of the electronic module 158 incorporating components of another embodiment of an engagement detection circuit in accordance with aspects of the present subject matter.

As shown in the FIGS. 25 and 26, unlike the embodiment described above in which the retention member 200 defines a continuous open ended slot 236 for receiving the release member 202, the retention member 200 includes first and second slot portions 236A and 236B spaced apart from one another by a divider wall 237. In such an embodiment, the engagement portion 240 of the release member 202 may be configured to be received in each slot portion 236A, 236B of the retention slot 236. For example, as shown in FIGS. 25 and 26, the engagement portion 240 may be divided into first and second engagement portions 240A, 240B, with the first engagement portion 240A being configured to be received within the first slot portion 236A of the retention slot 236 and the second engagement portion 240B being configured to be received within the second slot portion 236B of the retention slot 236.

Additionally, as indicated above, the electronic module 158 may incorporate one or more components of an engagement detection circuit configured to provide an indication of whether the release member 202 is located at the locked position relative to the retention member 200. Specifically, in several embodiments, the engagement detection circuit may include both a movable conductive member 674 and a corresponding ground member 673 configured to be positioned at the interface between the release member 202 and the retention member 200. For example, as particularly shown in FIG. 26, the movable conductive member 674 and the ground member 273 are both coupled to the release member 202 at locations defined between the first and second engagement portions 240A, 240B. However, in other embodiments, the movable conductive member 674 and the ground member 572 may be coupled to the release member 202 at any other suitable location relative to the interface defined between the release member 202 and the retention member 200. Alternatively, the movable conductive member 674 and the ground member 673 may be coupled to the retention member 200 at a suitable location relative to the interface between the release member 202 and the retention member 200.

In several embodiments, the movable conductive member 674 may be configured to be actuated or moved relative to the ground member 673 as the release member 202 is moved between its locked and unlocked positions. For example, the movable conductive member 674 may correspond to a spring-like member that may be compressed inwardly into contact with the ground member 673 when the release member 202 is at the locked position and may subsequently spring outwardly or otherwise release from the ground member 673 when the release member 202 is moved towards its unlocked position. Specifically, as shown in FIG. 25, when the release member 202 is at the locked position, the movable conductive member 674 may be compressed between the release member 202 and the retention member 200 (e.g., the divider wall 237 of the retention member 200) such that the conductive member 674 contacts the ground member 673, thereby closing the electrical circuit. However, as shown in FIG. 26, when the release member 202 is moved away from the retention member 200 towards the unlocked position, the movable conductive member 673 may spring outwardly away from the ground member 673, thereby stopping contact between the conductive member 674 and the ground member 673 and, thus, opening the electrical circuit.

It should be appreciated that the ground member 673 may be grounded in any suitable manner. For example, in one embodiment, the ground member 673 may be indirectly grounded to the module housing 206 via the biasing mechanism 250 (e.g., as indicated by the electrical coupling shown in dashed lines 693 in FIGS. 25 and 26). In another embodiment, the ground member 673 may be directly grounded to the module housing 206 or any other suitable ground source.

It should also be appreciated that, in several embodiments, the movable conductive member 674 may be electrically coupled to the module's printed circuit board 276 via a suitable connector 697 (e.g., as indicated by the electrical coupling shown in dashed lines 695 in FIGS. 25 and 26). As such, it may be quickly and easily determined whether the release member 202 is in its locked position. For example, if the module's processor(s) 182 detects that the engagement detection circuit is closed, it may be determined that the release member 202 is at the locked position. However, if the module's processor(s) 182 detects that the engagement detection circuit is opened, it may be determined that the release member 202 has, at the very least, moved away from the retention member 202 toward its unlocked position.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A modular electronic device, comprising:
   a plurality of electronic modules, the plurality of electronic modules including a first electronic module, the first electronic module including a module housing;
   a frame defining a plurality of bays, the frame adapted to respectively receive the plurality of electronic modules at the plurality of bays, the plurality of bays including a first bay configured to receive the first electronic module;
   a fixed retention member associated with the frame;
   a release member associated with the module housing, the release member being movable relative to the retention member between a locked position, wherein the retention member is configured to engage the release member so as to retain the first electronic module within the first bay, and an unlocked position, wherein the release member is disengaged from the retention member;
   an electromechanical actuator provided in operative association with the release member for actuating the release member between the locked and unlocked positions; and
   an engagement detection circuit configured to provide an indication of whether the release member is located at the locked position relative to the retention member.

2. The modular electronic device of claim 1, wherein the engagement detection circuit includes at least one ground member associated with the retention member and first and second conductive members associated with the release member, the electromechanical actuator including a first shape memory wire electrically coupled to the first conductive member and a second shape memory wire electrically coupled to the second conductive member,
   wherein, when the release member is at the locked position, the first and second conductive members electrically contact the at least one ground member to close the engagement detection circuit and, when the release member is moved from the locked position to the unlocked position, the first and second conductive members are moved away from the at least one ground member such that the engagement detection circuit is opened.

3. The modular electronic device of claim 2, wherein each of the first and second shape memory wires extends between a first end coupled to its respective conductive member and a second end coupled to a current source.

4. The modular electronic device of claim 2, wherein the at least one ground member comprises a first ground member configured to electrically contact the first conductive member and a second ground member configured to electrically contact the second conductive member.

5. The modular electronic device of claim 2, wherein, when the release member is at the locked position, an engagement interface is defined between a first surface of the release member and a second surface of the retention member, the first and second conductive members being positioned at or adjacent to the first surface and the at least one ground member being positioned at or adjacent to the second surface such that an electrical connection is provided between the first and second conductive members and the at least one ground member at the engagement interface.

6. The modular electronic device of claim 5, wherein at least a portion of the at least one ground member extends outwardly from the second surface in a release direction of the first electronic module such that the electrical connection is temporarily maintained across a distance defined in the release direction as the release member is moved away from the frame in the release direction.

7. The modular electronic device of claim 2, wherein the first and second conductive members are positioned on the release member so as to be electrically isolated from one another.

8. The modular electronic device of claim 1, wherein the engagement detection circuit includes a movable conductive member coupled to the release member, the movable conductive member being movable relative to a ground member of the engagement detection circuit as the release member is moved between the locked and unlocked positions.

9. The modular electronic device of claim 8, wherein, when the release member is at the locked position, the movable conductive member is compressed between the release member and the retention member and electrically contacts the ground member to close the engagement detection circuit.

10. The modular electronic device of claim 9, wherein, when the release member is moved from the locked position to the unlocked position, the movable conductive member moves away from the ground member such that the engagement detection circuit is opened.

11. The modular electronic device of claim 8, wherein the ground member is coupled to the release member adjacent to the movable conductive member.

12. A method for assembling an electronic module configured for use with a modular electronic device, the method comprising:
    positioning a first shield component on a support surface;
    positioning a printed circuit board assembly on top of the first shield component such that the printed circuit board assembly is supported above the support surface;
    installing at least one actuator component of an electromechanical actuator relative to the printed circuit board assembly; and
    positioning a second shield component relative to the first shield component such that the printed circuit board assembly and the at least one actuator component are positioned between the first and second shield components.

13. The method of claim 12, further comprising coupling the printed circuit board assembly to the first shield component prior to installing the at least one actuator component relative to the printed circuit board assembly.

14. The method of claim 12, wherein the at least one actuator component includes a first shape memory wire and a second shape memory wire, each of the first and second shape memory wires extending lengthwise between a first end coupled to a release member of the electronic module and a second end opposite the first end.

15. The method of claim 14, wherein installing the at least one actuator component relative to the printed circuit board assembly comprises:
    initially positioning the release member relative to the printed circuit board assembly; and
    moving the second end of each of the first and second shape memory wires away from the release member to tension the first and second shape memory wires.

16. The method of claim 15, wherein a fixture component extends through an opening defined through the printed circuit board assembly, wherein initially positioning the release member relative to the printed circuit board assembly comprises positioning the release member relative to the printed circuit board assembly such that the release member engages a portion of the fixture component extending through the opening.

17. The method of claim 15, wherein the second end of each of the first and second shape memory wires is coupled to a contactor configured to be separately coupled to the printed circuit board assembly.

18. The method of claim 12, further comprising coupling the second shield component to the first shield component.

19. The method of claim 12, further comprising mounting one or more internal components of the electronic module to a printed circuit board to form the printed circuit board assembly.

20. The method of claim 12, wherein the printed circuit board assembly includes a first printed circuit board and a second printed circuit board.

21. The method of claim 20, further comprising coupling the first printed circuit board to the second printed circuit board prior to positioning the printed circuit board assembly on top of the first shield component.

22. The method of claim 21, wherein the first and second printed circuit boards are coupled together via a flexible printed circuit.

23. A method for assembling an electronic module configured for use with a modular electronic device, the method comprising:
    positioning a first shield component on a support surface;
    positioning a printed circuit board assembly on top of the first shield component such that the printed circuit board assembly is supported above the support surface, the printed circuit board assembly including a printed circuit board and at least one internal component of the electronic module mounted to the printed circuit board; and
    positioning a second shield component relative to the first shield component such that the printed circuit board assembly is encased between the first and second shield components.

24. The method of claim 23, wherein the printed circuit board defines a slot configured to be aligned with a corresponding opening defined through one of the first shield component or the second shield component when the printed circuit board assembly is encased between the first and second shield components.

* * * * *